US009971680B2

(12) United States Patent
Uesugi et al.

(10) Patent No.: US 9,971,680 B2
(45) Date of Patent: May 15, 2018

(54) SEMICONDUCTOR DEVICE AND ELECTRONIC DEVICE

(71) Applicant: Semiconductor Energy Laboratory Co., Ltd., Atsugi-shi, Kanagawa-ken (JP)

(72) Inventors: Wataru Uesugi, Kanagawa (JP); Tomoaki Atsumi, Kanagawa (JP); Naoaki Tsutsui, Kanagawa (JP); Hikaru Tamura, Kanagawa (JP); Takahiko Ishizu, Kanagawa (JP); Takuro Ohmaru, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 188 days.

(21) Appl. No.: 14/731,940

(22) Filed: Jun. 5, 2015

(65) Prior Publication Data

US 2015/0363136 A1 Dec. 17, 2015

(30) Foreign Application Priority Data

Jun. 13, 2014 (JP) ................................. 2014-122062

(51) Int. Cl.
*G06F 12/00* (2006.01)
*G11C 5/00* (2006.01)
(Continued)

(52) U.S. Cl.
CPC ................ *G06F 12/00* (2013.01); *G11C 5/00* (2013.01); *H01L 27/1225* (2013.01);
(Continued)

(58) Field of Classification Search
CPC .... G06F 3/0611; G06F 3/0619; G06F 3/0656; G06F 3/0659; G06F 3/0683; G06F 9/48; G06F 11/1458
(Continued)

(56) References Cited

U.S. PATENT DOCUMENTS 5,731,856 A 3/1998 Kim et al.
5,744,864 A 4/1998 Cillessen et al.
(Continued)

FOREIGN PATENT DOCUMENTS

EP 1737044 A 12/2006
EP 2226847 A 9/2010
(Continued)

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.
(Continued)

*Primary Examiner* — Gary Portka
(74) *Attorney, Agent, or Firm* — Fish & Richardson P.C.

(57) ABSTRACT

A semiconductor device including a register controller and a processor which includes a register is provided. The register includes a first circuit and a second circuit which includes a plurality of memory portions. The first circuit and the plurality of memory portions can store data by an arithmetic process of the processor. Which of the plurality of memory portions the data is stored in depends on a routine by which the data is processed. The register controller switches the routine in response to an interrupt signal. The register controller can make any one of the plurality of memory portions which corresponds to the routine store the data in the first circuit every time the routine is switched.

(Continued)

The register controller can make data stored in any one of the plurality of memory portions which corresponds to the routine be stored in the first circuit every time the routine is switched.

12 Claims, 21 Drawing Sheets

(51) Int. Cl.
  *H01L 27/12* (2006.01)
  *H01L 29/778* (2006.01)
  *H01L 27/06* (2006.01)
  *H01L 27/1156* (2017.01)
  *H01L 29/24* (2006.01)

(52) U.S. Cl.
  CPC ....... *H01L 27/0688* (2013.01); *H01L 27/1156* (2013.01); *H01L 29/24* (2013.01); *H01L 29/7782* (2013.01)

(58) Field of Classification Search
  USPC .................................................. 711/104, 109
  See application file for complete search history.

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 8,314,637 B2 | 11/2012 | Kato et al. |
| 8,410,838 B2 | 4/2013 | Kato et al. |
| 8,432,187 B2 | 4/2013 | Kato et al. |
| 8,575,985 B2 | 11/2013 | Ohmaru et al. |
| 8,754,693 B2 | 6/2014 | Nishijima |
| 8,860,485 B2 | 10/2014 | Kato et al. |
| 8,994,400 B2 | 3/2015 | Kato et al. |
| 9,024,669 B2 | 5/2015 | Ohmaru et al. |
| 9,065,438 B2 | 6/2015 | Aoki et al. |
| 9,207,751 B2 | 12/2015 | Nishijima |
| 9,330,759 B2 | 5/2016 | Ohmaru et al. |
| 9,350,334 B2 | 5/2016 | Kato et al. |
| 9,423,860 B2 | 8/2016 | Nishijima et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2013/0036426 A1* | 2/2013 | Igura ...................... G06F 9/461 718/108 |
| 2013/0057315 A1 | 3/2013 | Kato et al. |
| 2013/0232365 A1 | 9/2013 | Nishijima |
| 2014/0068300 A1 | 3/2014 | Nishijima et al. |
| 2014/0368235 A1 | 12/2014 | Aoki et al. |
| 2015/0022651 A1 | 1/2015 | Kato et al. |
| 2015/0070962 A1 | 3/2015 | Ohmaru et al. |
| 2015/0200657 A1 | 7/2015 | Kato et al. |
| 2015/0212738 A1* | 7/2015 | D'Eliseo ............... G06F 3/0659 711/154 |
| 2015/0227378 A1 | 8/2015 | Kurokawa |
| 2016/0225774 A1 | 8/2016 | Ohmaru et al. |
| 2016/0226471 A1 | 8/2016 | Kato et al. |

FOREIGN PATENT DOCUMENTS

| | | |
|---|---|---|
| JP | 60-198861 A | 10/1985 |
| JP | 63-210022 A | 8/1988 |

(56) References Cited

FOREIGN PATENT DOCUMENTS

| | | |
|---|---|---|
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2013-009297 A | 1/2013 |
| WO | WO-2004/114391 | 12/2004 |

OTHER PUBLICATIONS

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions of Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTS", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTS) for AMLCDS", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel,YbFe2O4, and Yb2Fe3O7 Types of Structures for Compounds in the In2O3 and Sc2O3—A2O3—BO Systems [A; Fe, Ga, or Al; B; Mg, Mn, Fe, Ni, Cu, or Zn] at Temperatures over 1000°C", Journal of Solid State Chemistry, 1985, vol. 60, pp. 382-384.

Kimizuka.N et al., "Syntheses and Single-Crystal Data of Homologous Compounds, In2O3(ZnO)m (m = 3, 4, and 5), InGaO3(ZnO)3, and Ga2O3(ZnO)m (m= 7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

(56) References Cited

OTHER PUBLICATIONS

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.
Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Miyasaka.M, "Suftla Flexible Microelectronics on Their Way to Business", SID Digest '07 : SID International Symposium Digest of Technical Papers, 2007, vol. 38, pp. 1673-1676.
Mo.Y et al., "Amorphous Oxide TFT Backplanes for Large Size AMOLED Displays", IDW '08 : Proceedings of the 6th International Display Workshops, Dec. 3, 2008, pp. 581-584.
Nakamura.M et al., "The phase relations in the $In_2O_3$—$Ga_2ZnO_4$—ZnO system at 1350°C", Journal of Solid State Chemistry, Aug. 1, 1991, vol. 93, No. 2, pp. 298-315.
Nakamura.M, "Synthesis of Homologous Compound with New Long-Period Structure", NIRIM Newsletter, Mar. 1, 1995, vol. 150, pp. 1-4.
Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.
Nomura.K et al., "Carrier transport in transparent oxide semiconductor with intrinsic structural randomness probed using single-crystalline $InGaO_3(ZnO)_5$ films", Appl. Phys. Lett. (Applied Physics Letters), Sep. 13, 2004, vol. 85, No. 11, pp. 1993-1995.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Nomura.K et al., "Thin-Film Transistor Fabricated in Single-Crystalline Transparent Oxide Semiconductor", Science, May 23, 2003, vol. 300, No. 5623, pp. 1269-1272.
Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.
Oba.F et al., "Defect energetics in ZnO: A hybrid Hartree-Fock density functional study", Phys. Rev. B (Physical Review. B), 2008, vol. 77, pp. 245202-1-254202-6.
Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.
Ohara.H et al., "21.3:4.0 in. QVGA AMOLED Display Using In—Ga—Zn-Oxide TFTs With a Novel Passivation Layer", SID Digest '09 : SID International Symposium Digest of Technical Papers, May 31, 2009, pp. 284-287.
Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Orita.M et al., "Amorphous transparent conductive oxide $InGaO_3(ZnO)m$ (m<4):a Zn4s conductor", Philosophical Magazine, 2001, vol. 81, No. 5, pp. 501-515.
Orita.M et al., "Mechanism of Electrical Conductivity of Transparent $InGaZnO_4$", Phys. Rev. B (Physical Review. B), Jan. 15, 2000, vol. 61, No. 3, pp. 1811-1816.
Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.
Osada.T et al., "Development of Driver-Integrated Panel Using Amorphous In—Ga—Zn-Oxide TFT", AM-FPD '09 Digest of Technical Papers, Jul. 1, 2009, pp. 33-36.
Park.J et al., "Amorphous Indium-Gallium-Zinc Oxide TFTs and Their Application for Large Size AMOLED", AM-FPD '08 Digest of Technical Papers, Jul. 2, 2008, pp. 275-278.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.
Park.J et al., "High performance amorphous oxide thin film transistors with self-aligned top-gate structure", IEDM 09: Technical Digest of International Electron Devices Meeting, Dec. 7, 2009, pp. 191-194.
Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.
Park.S et al., "Challenge to Future Displays: Transparent AM-OLED Driven by Peald Grown ZnO TFT", IMID '07 Digest, 2007, pp. 1249-1252.
Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Prins.M et al., "A Ferroelectric Transparent Thin-Film Transistor", Appl. Phys. Lett. (Applied Physics Letters), Jun. 17, 1996, vol. 68, No. 25, pp. 3650-3652.
Sakata.J et al., "Development of 4.0-in. AMOLED Display With Driver Circuit Using Amorphous In—Ga—Zn-Oxide TFTs", IDW '09 : Proceedings of the 16th International Display Workshops, 2009, pp. 689-692.
Son.K et al., "42.4L: Late-News Paper: 4 Inch QVGA AMOLED Driven by the Threshold Voltage Controlled Amorphous GIZO ($Ga_2O_3$—$In_2O_3$—ZnO) TFT", SID Digest '08 : SID International Symposium Digest of Technical Papers, May 20, 2008, vol. 39, pp. 633-636.
Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.
Tsuda.K et al., "Ultra Low Power Consumption Technologies for Mobile TFT-LCDs ", IDW '02 : Proceedings of the 9th International Display Workshops, Dec. 4, 2002, pp. 295-298.
Ueno.K et al., "Field-Effect Transistor on $SrTiO_3$ With Sputtered $Al_2O_3$ Gate Insulator", Appl. Phys. Lett. (Applied Physics Letters), Sep. 1, 2003, vol. 83, No. 9, pp. 1755-1757.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

* cited by examiner

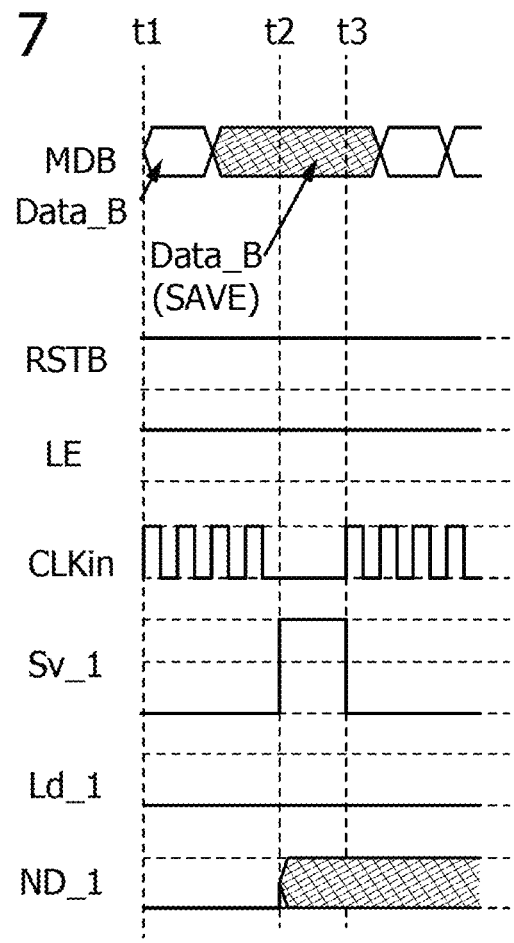

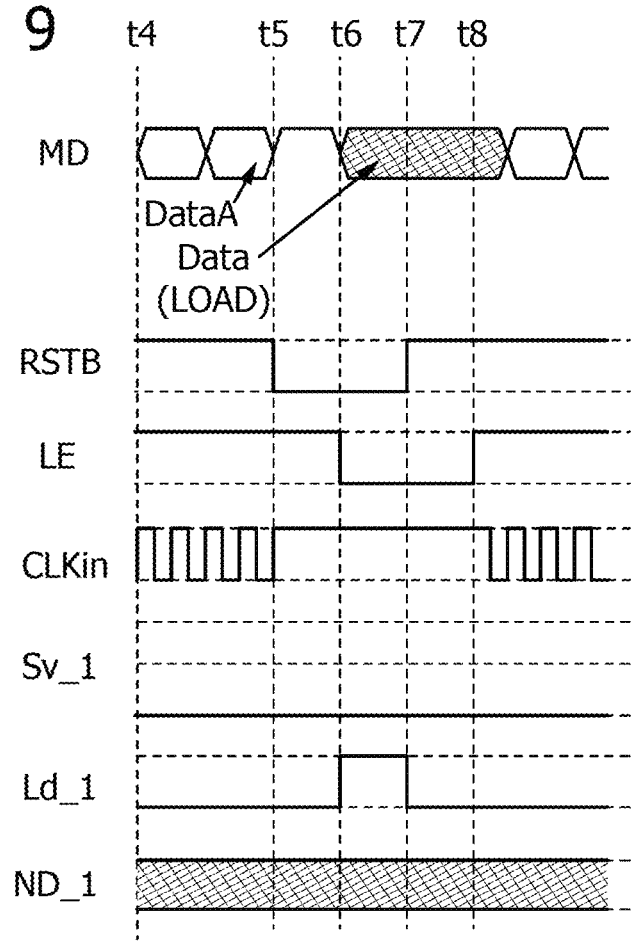

SEMICONDUCTOR DEVICE AND ELECTRONIC DEVICE

BACKGROUND OF THE INVENTION

1. Field of the Invention

One embodiment of the present invention relates to a semiconductor device.

Note that one embodiment of the present invention is not limited to the above technical field. The technical field of the invention disclosed in this specification and the like relates to an object, a method, or a manufacturing method. In addition, one embodiment of the present invention relates to a process, a machine, manufacture, or a composition of matter. Specifically, examples of the technical field of one embodiment of the present invention disclosed in this specification include a semiconductor device, a display device, a light-emitting device, a power storage device, a memory device, a method for driving any of them, and a method for manufacturing any of them.

2. Description of the Related Art

The technical development of a semiconductor device that can hold charges corresponding to data by using a transistor including an oxide semiconductor in its channel formation region (OS transistor) and a transistor including silicon in its channel formation region (Si transistor) in combination has been progressing. Such a semiconductor device consumes less power than a static RAM (SRAM) and therefore usage as a processor or the like has been actively developed (e.g., see Patent Document 1).

REFERENCE

Patent Document

[Patent Document 1] Japanese Published Patent Application No. 2013-9297

SUMMARY OF THE INVENTION

An object of one embodiment of the present invention is to provide a novel semiconductor device or the like.

Another object of one embodiment of the present invention is to provide a semiconductor device or the like that has a novel structure and is excellent in data processing efficiency. Another object of one embodiment of the present invention is to provide a semiconductor device or the like that has a novel structure and is excellent in low power consumption.

Note that objects of one embodiment of the present invention are not limited to the aforementioned objects. The objects described above do not disturb the existence of other objects. The other objects are the ones that are not described above and will be described below. The other objects will be apparent from and can be derived from the description of the specification, the drawings, and the like by those skilled in the art. One embodiment of the present invention solves at least one of the aforementioned objects and the other objects.

One embodiment of the present invention is a semiconductor device which includes a register controller and a processor including a register. The register includes a first circuit and a second circuit. The first circuit has a function of storing data obtained by an arithmetic process of the processor. The second circuit includes a plurality of memory portions. The plurality of memory portions have a function of storing data obtained by an arithmetic process of the processor. Which of the plurality of memory portions the data is stored in depends on a routine by which the data is processed. The register controller has a function of making any one of the plurality of memory portions which corresponds to the routine store the data in the first circuit every time the routine is switched. The register controller has a function of making data stored in any one of the plurality of memory portions which corresponds to the routine be stored in the first circuit every time the routine is switched.

In the above embodiment of the present invention, each of the plurality of memory portions preferably includes a first transistor and a second transistor, a gate of the second transistor is preferably electrically connected to a source or a drain of the first transistor, and the memory portion preferably has a function of holding charges corresponding to data in the gate of the second transistor when the first transistor is in an off state.

In the above embodiment of the present invention, the first transistor preferably includes an oxide semiconductor in its channel formation region, and the oxide semiconductor preferably includes In, Ga, and Zn.

One embodiment of the present invention is an electronic device including the above-described semiconductor device and a display device or a speaker.

Note that other embodiments of the present invention will be described in Embodiments 1 to 7 and the drawings.

With one embodiment of the present invention, a semiconductor device or the like with a novel structure can be provided.

With one embodiment of the present invention, a semiconductor device or the like that has a novel structure and is excellent in data processing efficiency can be provided. With one embodiment of the present invention, a semiconductor device or the like that has a novel structure and is excellent in low power consumption can be provided.

Note that the description of these effects does not disturb the existence of other effects. One embodiment of the present invention does not necessarily have all of these effects. Other effects will be apparent from and can be derived from the description of the specification, the drawings, the claims, and the like.

BRIEF DESCRIPTION OF THE DRAWINGS

In the accompanying drawings:

FIG. 7 is a timing chart;

FIG. 9 is a timing chart;

DETAILED DESCRIPTION OF THE INVENTION

Figure 1:
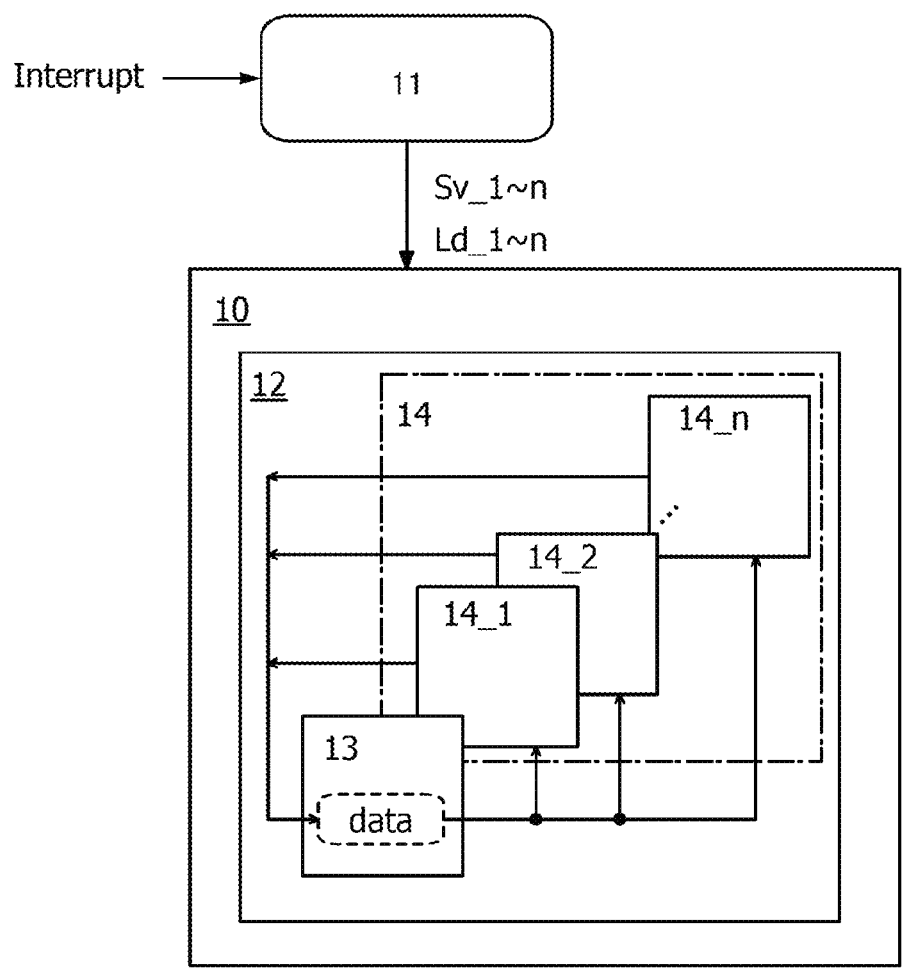
FIG. 1 illustrates a configuration example of a semiconductor device.

Embodiments will be described below with reference to drawings. The embodiments can be implemented with various modes, and it will be readily appreciated by those skilled in the art that modes and details can be changed in various ways without departing from the spirit and scope of the present invention. Thus, the present invention should not be interpreted as being limited to the following description of the embodiments.

Note that one embodiment of the present invention includes, in its category, semiconductor devices in which power gating is performed, such as an integrated circuit, an RF tag, and a semiconductor display device. The integrated circuits include, in its category, large scale integrated circuits (LSIs) including a microprocessor, an image processing circuit, a digital signal processor (DSP), and a microcontroller, and programmable logic devices (PLDs) such as a field programmable gate array (FPGA) and a complex PLD (CPLD). The semiconductor display device includes the following in its category: liquid crystal display devices, light-emitting devices in which a light-emitting element typified by an organic light-emitting diode (OLED) is provided in each pixel, electronic paper, digital micromirror devices (DMDs), plasma display panels (PDPs), field emission displays (FEDs), and other semiconductor display devices.

In the drawings, the size, the layer thickness, or the region is exaggerated for clarity in some cases. Therefore, embodiments of the present invention are not limited to such a scale. Note that the drawings are schematic views showing ideal examples, and embodiments of the present invention are not limited to shapes or values shown in the drawings. For example, the following can be included: variation in signal, voltage, or current due to noise or difference in timing.

In this specification and the like, a transistor is an element having at least three terminals: a gate, a drain, and a source. The transistor includes a channel region between the drain (a drain terminal, a drain region, or a drain electrode) and the source (a source terminal, a source region, or a source electrode) and current can flow through the drain, the channel region, and the source.

Here, since the source and the drain of the transistor change depending on the structure, the operating condition, and the like of the transistor, it is difficult to define which is a source or a drain. Thus, a portion that functions as a source or a portion that functions as a drain is not referred to as a source or a drain in some cases. Instead, one of the source and the drain might be referred to as a first electrode, and the other of the source and the drain might be referred to as a second electrode.

Note that in this specification, ordinal numbers such as "first", "second", and "third" are used in order to avoid confusion among components, and thus do not limit the number of the components.

In this specification, the expression "A and B are connected" means the case where A and B are electrically connected to each other in addition to the case where A and B are directly connected to each other. Here, the expression "A and B are electrically connected" means the case where electric signals can be transmitted and received between A and B when an object having any electric action exists between A and B.

Note that, for example, the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y, can be expressed by using any of the following expressions.

The expressions include, for example, "X Y, a source (or a first terminal or the like) of a transistor, and a drain (or a second terminal or the like) of the transistor are electrically connected to each other, and X the source (or the first terminal or the like) of the transistor, the drain (or the second terminal or the like) of the transistor, and Y are electrically connected to each other in this order", "a source (or a first terminal or the like) of a transistor is electrically connected to X a drain (or a second terminal or the like) of the transistor is electrically connected to Y, and X the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X the source (or the first terminal or the like) of the transistor, the drain (or the second terminal or the like) of the transistor, and Y are provided to be connected in this order". When the connection order in a circuit configuration is defined by an expression similar to the above examples, a source (or a first terminal or the like) and a drain (or a second terminal or the like) of a transistor can be distinguished from each other to specify the technical scope.

Other examples of the expressions include, "a source (or a first terminal or the like) of a transistor is electrically connected to X through at least a first connection path, the first connection path does not include a second connection path, the second connection path is a path between the source (or the first terminal or the like) of the transistor and a drain (or a second terminal or the like) of the transistor, Z1 is on the first connection path, the drain (or the second terminal or the like) of the transistor is electrically connected to Y through at least a third connection path, the third connection path does not include the second connection path, and Z2 is on the third connection path". It is also possible to use the expression "a source (or a first terminal or the like) of a transistor is electrically connected to X through at least Z1 on a first connection path, the first connection path does not include a second connection path, the second connection path includes a connection path through the transistor, a drain (or a second terminal or the like) of the transistor is electrically connected to Y through at least Z2 on a third connection path, and the third connection path does not include the second connection path".

Still another example of the expression is "a source (or a first terminal or the like) of a transistor is electrically connected to X through at least Z1 on a first electrical path, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y through at least Z2 on a third electrical path, the third electrical path does not include a fourth electrical path, and the fourth electrical path is an electrical path from the drain (or the second terminal or the like) of the transistor to the source (or the first terminal or the like) of the transistor". When the connection path in a circuit structure is defined by an expression similar to the above examples, a source (or a first terminal or the like) and a drain (or a second terminal or the like) of a transistor can be distinguished from each other to specify the technical scope.

Note that these expressions are examples and the expression is not limited to these examples. Here, X, Y, Z1, and Z2 each denote an object (e.g., a device, an element, a circuit, a wiring, an electrode, a terminal, a conductive film, and a layer).

Note that in this specification, terms for describing arrangement, such as "over" and "under", are used for convenience to describe the positional relation between components with reference to drawings. Further, the positional relation between components is changed as appropriate in accordance with a direction in which each component is described. Thus, the positional relation is not limited to that described with a term used in this specification and can be explained with another term as appropriate depending on the situation.

The positional relation of circuit blocks in a block diagram is specified for description. Even when a block diagram shows that different functions are achieved by different circuit blocks, one circuit block may be actually configured to achieve the different functions. Functions of circuit blocks in a diagram are specified for description, and even when a diagram shows one circuit block performing given processing, a plurality of circuit blocks may be actually provided to perform the processing.

In this specification, the term "parallel" indicates that the angle formed between two straight lines is greater than or equal to −10° and less than or equal to 10°, and accordingly also includes the case where the angle is greater than or equal to −5° and less than or equal to 5°. The term "perpendicular" indicates that the angle formed between two straight lines is greater than or equal to 80° and less than or equal to 100°, and accordingly also includes the case where the angle is greater than or equal to 85° and less than or equal to 95°.

In this specification, trigonal and rhombohedral crystal systems are included in a hexagonal crystal system.

Note that the terms "film" and "layer" can be interchanged with each other depending on the case or circumstances. For example, the term "conductive layer" can be changed into the term "conductive film" in some cases. Also, the term "insulating film" can be changed into the term "insulating layer" in some cases.

Embodiment 1

In this embodiment, configuration examples of a semiconductor device are described.

FIG. 1 is a block diagram illustrating a configuration example of a semiconductor device. In FIG. 1, a semiconductor device 100 includes a processor 10 and a register controller 11. The processor 10 includes a register 12. The register 12 includes a memory circuit 13 and a memory circuit 14. The memory circuit 14 includes a plurality of memory portions 14_1 to 14_$n$ ($n$ is a natural number of 2 or more).

The memory circuit 13 is a circuit having a function of temporarily storing data that is processed by the processor 10. In some cases, the memory circuit 13 is simply referred to as a circuit. Specific examples of the memory circuit 13 include a flip-flop, an SRAM, and the like. The data that is processed by the processor 10 includes not only data obtained by arithmetic but also program execution data. Here, the program execution data includes an address (the value of a program counter (PC)), a status flag, and the like.

The memory circuit 14 is a circuit that can temporarily store the data stored in the memory circuit 13, into which the data is saved (stored or backed up) and from which the data is loaded (restored or recovered). Data saving or loading between the memory circuit 13 and the memory circuit 14 is controlled in accordance with a signal output from the register controller 11.

The data stored in the memory circuit 14 is stored in the plurality of memory portions 14_1 to 14_$n$. The plurality of memory portions 14_1 to 14_$n$ save the data stored in the memory circuit 13 in accordance with the routine. Saving of the data is performed with signals Sv_1 to Sv_n supplied from the register controller 11. The signals Sv_1 to Sv_n are output in response to an interrupt signal (also referred to as an interrupt control signal and described as "Interrupt" in the drawing) supplied to the register controller 11. The interrupt signal switches the routine. In order that in-process data in the processor 10 is temporarily saved from the memory circuit 13 into the memory circuit 14, the signals Sv_1 to Sv_n corresponding to the routine are output.

For example, in the case where the data processed by a first routine is stored in the memory circuit 13, the memory portion 14_1 is configured to be selected as the memory portion for saving the data into the memory circuit 14. In the case where the data processed by a second routine is stored in the memory circuit 13, the memory portion 14_2 is configured to be selected as the memory portion for saving the data into the memory circuit 14.

The data saved into the plurality of memory portions 14_1 to 14_$n$ are loaded into the memory circuit 13 in accordance with the routine that is to execute an instruction in the processor 10. Loading of the data is performed with signals Ld_1 to Ld_n supplied from the register controller 11. The signals Ld_1 to Ld_n are output in response to the interrupt signal (described as "Interrupt" in the drawing) supplied to the register controller 11. The interrupt signal switches the routine. To load the data for the routine switched in the processor 10, the signals Ld_1 to Ld_n corresponding to the routine are output.

For example, in the case where the first routine is processed in the processor 10, the memory portion 14_1 is configured to be selected and the data is loaded into the memory circuit 13. In the case where the second routine is processed in the processor 10, the memory portion 14_2 is configured to be selected and the data is loaded into the memory circuit 13.

By the structure of performing saving or loading between the memory circuit 13 and the plurality of memory portions 14_1 to 14_$n$ in accordance with the routine executed in the processor 10, a plurality of routines can interrupt in response to the interrupt signal in data processing of the processor 10. When another routine interrupts, data is saved from the memory circuit 13 into the memory circuit 14 or loaded from the memory circuit 14 into the memory circuit 13; thus, although in-process routine is suspended to execute a different routine by priority, the routine executed immediately before the interrupt can be restarted. Since the data for restarting the interrupted routine is stored inside the processor 10, no access to a stack region of an external memory such as an SRAM or a DRAM is required for data saving or loading. Therefore, even when a process of switching from a current routine to a different routine is performed by an interrupt, the data saving or loading process due to the switching can be performed efficiently without causing a lag of memory access or the like.

The processor 10 is a circuit having a function of executing a program written in computer language. The processor 10 includes an arithmetic portion and a control portion. The processor 10 may be a single-core processor or a multi-core processor such as a dual-core processor or a many-core processor.

The register controller 11 is a circuit having a function of outputting signals for performing saving or loading between the memory circuit 13 and the plurality of memory portions 14_1 to 14_n in response to the interrupt signal. The signals for saving or loading the data are the signals Sv_1 to Sv_n and the signals Ld_1 to Ld_n. Each of the signals is controlled so as to correspond to the routine switched by the interrupt signal. Accordingly, every time the routine is switched, the register controller 11 can make any one of the plurality of memory portions 14_1 to 14_n that corresponds to the routine store the data in the memory circuit 13. Furthermore, every time the routine is switched, the register controller 11 can make the data stored in any one of the plurality of memory portions 14_1 to 14_n that corresponds to the routine be stored in the memory circuit 13.

The register 12 is a circuit for storing data processed in the processor 10 and includes the memory circuit 13 and the memory circuit 14. The register 12 is a circuit for storing data in the processor 10 and, for example, a circuit used in a register file, a pipeline register, or the like.

Figure 2:
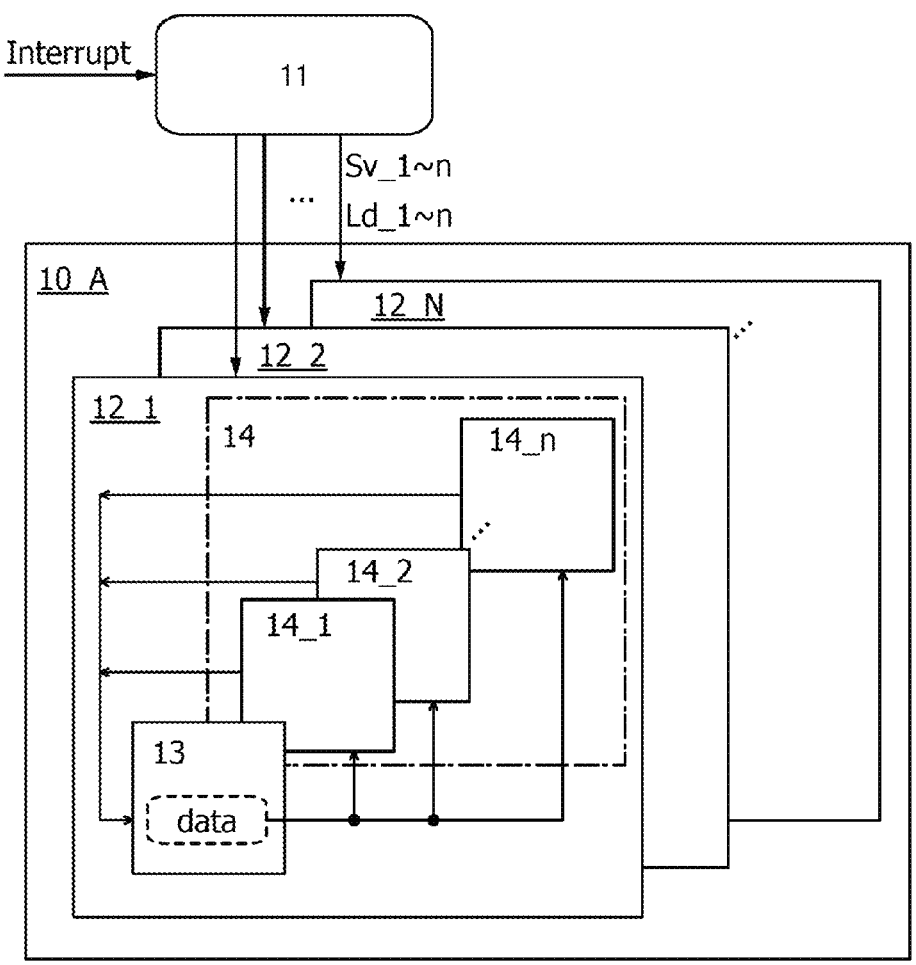
FIG. 2 illustrates a configuration example of a semiconductor device.

Although one register 12 is provided in the semiconductor device 100 in the configuration in FIG. 1, another configuration may also be employed. For example, the semiconductor device 100 may include a plurality of registers. In the semiconductor device 100 illustrated in FIG. 2, a processor 10_A includes a plurality of registers 12_1 to 12_N (N is a natural number of 2 or more). Note that the register controller 11 outputs the signals Sv_1 to Sv_n and the signals Ld_1 to Ld_n to each of the plurality of registers 12_1 to 12_N so that data saving or loading between the memory circuit 13 and the plurality of memory portions 14_1 to 14_n can be controlled in each of the plurality of registers 12_1 to 12_N. The configuration of FIG. 2 enables the plurality of registers 12_1 to 12_N to independently perform data processing with interrupts of a plurality of routines.

Although one processor 10 is provided in the semiconductor device 100 in the configuration of FIG. 1, another configuration may also be employed. For example, a plurality of processors may be provided in the semiconductor device 100.

The memory circuit 13 is a circuit having a function of storing data obtained by an arithmetic process of the processor 10. The memory circuit 13 is preferably a memory circuit that can write and read data at high speed. For example, a flip-flop or an SRAM which is formed of a combination of a transmission gate, a transistor, an inverter, a logic circuit such as a NAND, or the like that includes a Si transistor can be used.

The flip-flop or SRAM that is used as the memory circuit 13 is preferably a circuit having a function of statically holding a potential corresponding to the input data. Furthermore, the memory circuit 13 preferably has a function of controlling data writing and reading in accordance with a clock signal, and for example has a master-slave circuit configuration. Moreover, the memory circuit 13 preferably has a function of initializing a held potential with a reset signal.

The memory circuit 14 and the plurality of memory portions 14_1 to 14_n included in the memory circuit 14 are circuits having a function of storing data obtained by an arithmetic process of the processor 10. Since the plurality of memory portions 14_1 to 14_n need to retain data for a certain period, they preferably consume low power for data retention.

Figure 3:
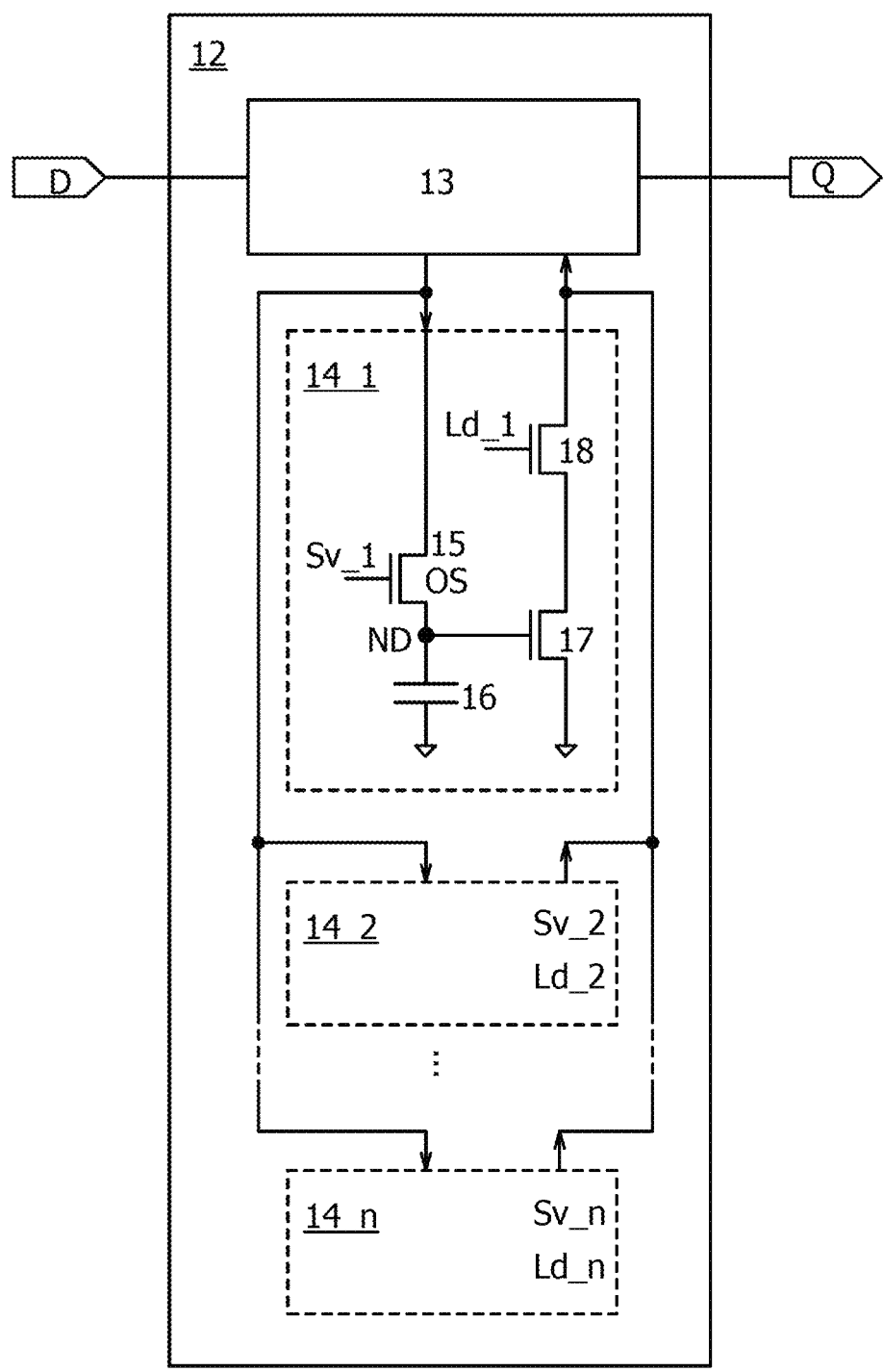
FIG. 3 illustrates a configuration example of a semiconductor device.

FIG. 3 illustrates a configuration example of the memory circuit 13 and the plurality of memory portions 14_1 to 14_n included in the register 12. In addition, FIG. 3 illustrates a specific circuit configuration that can be applied to the plurality of memory portions 14_1 to 14_n. Data is supplied to a terminal D of the memory circuit 13 and data is output from a terminal Q of the memory circuit 13. In addition, the memory circuit 13 is connected to each of the plurality of memory portions 14_1 to 14_n. To the plurality of memory portions 14_1 to 14_n, a corresponding one of the signals Sv_1 to Sv_n and a corresponding one of the signals Ld_1 to Ld_n are supplied.

The plurality of memory portions 14_1 to 14_n have the same circuit configuration. For example, the memory portion 14_1 includes a transistor 15, a capacitor 16, a transistor 17, and a transistor 18.

One of a source and a drain of the transistor 15 is connected to a node for storing data (memory node) included in the memory circuit 13. The other of the source and the drain of the transistor 15 is connected to a gate of the transistor 17. A gate of the transistor 15 is connected to a wiring to which the signal Sv_1 is supplied.

One electrode of the capacitor 16 is connected to the gate of the transistor 17. The other electrode of the capacitor 16 is connected to a wiring to which a reference potential is supplied, for example, a ground line. The other electrode of the capacitor 16 may be connected to another wiring such as a wiring to which a power supply potential is supplied.

One of a source and a drain of the transistor 17 is connected to a wiring to which a reference potential is supplied, for example, a ground line. The other of the source and the drain of the transistor 17 is connected to one of a source and a drain of the transistor 18. The gate of the transistor 17 is connected to the other of the source and the drain of the transistor 15. In the following description, a node to which the gate of the transistor 17 is connected is referred to as a node ND.

The one of the source and the drain of the transistor 18 is connected to the other of the source and the drain of the transistor 17. The other of the source and the drain of the transistor 18 is connected to a memory node included in the memory circuit 13. A gate of the transistor 18 is connected to a wiring to which the signal Ld_1 is supplied. Note that the memory node of the memory circuit 13 to which the other of the source and the drain of the transistor 18 is connected is preferably different from the memory node to which the one of the source and the drain of the transistor 15 is connected. In this case, the memory nodes preferably hold different logic data from each other.

The operation of the memory portion 14_1 is briefly described. In the following description, the transistors 15, 17, and 18 are assumed to be n-channel transistors. When they are p-channel transistors, the supplied signals have opposite polarities.

First, an operation of saving a potential corresponding to data in the memory circuit 13 (data potential) into the memory portion 14_1 is described.

The signal Sv_1 is set at H level to bring the transistor 15 in an on state, which makes the potential of the memory node included in the memory circuit 13 equal to the potential of the node ND.

Next, the signal Sv_1 is set at L level to bring the transistor 15 in an off state. Charges corresponding to the data potential are held in the node ND. The transistor 15 preferably has a low current flowing between the source and the drain in an off state (low off-state current).

By the above-described operation, the operation of saving the data potential of the memory circuit 13 into the memory portion 14_1 is completed.

Note that the transistor with low off-state current is preferably an OS transistor. An oxide semiconductor that can be used in the OS transistor preferably includes In, Ga, and Zn. In some circuit diagrams, "OS" is written beside a circuit symbol of the transistor 15 to clearly show that the transistor 15 is an OS transistor.

Next, an operation of loading the data potential held in the memory portion 14_1 into the memory circuit 13 is described.

First, the memory node of the memory circuit 13 is precharged. In the example described here, the memory node is precharged at H level.

Then, the signal Ld_1 is set at H level to bring the transistor 18 in an on state. At this time, the transistor 17 is either in an on state or an off state depending on the charges corresponding to the data potential held in the node ND.

For example, in the case where the data potential held in the node ND is at H level, the transistor 17 is in an on state. In this case, the potential of the ground line, which is a reference potential, i.e., an L level potential, is loaded into the memory node through the transistors 17 and 18. The memory node into which the potential of the ground line is loaded is different from the node into which the data potential is saved, and the original data can be loaded.

For example, in the case where the data potential held in the node ND is at L level, the transistor 17 is in an off state. In this case, the memory node of the memory circuit 13 remains at the precharge potential, i.e., the H level potential, and the H level potential is loaded into the memory node.

Through the above-described operation, the operation of loading the data potential of the memory circuit 13 into the memory circuit 13 is completed.

FIGS. 4A to 4D illustrate circuit configurations that can be applied to the memory portions 14_1 to 14_n illustrated in FIG. 3.

Figure 4A:
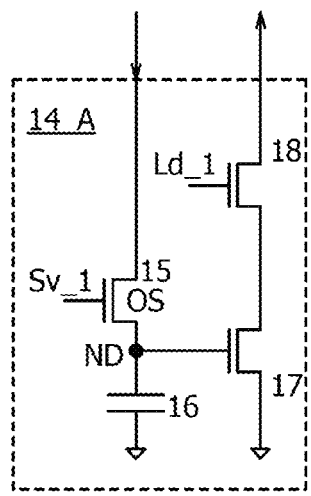
FIGS. 4A to 4D illustrate configuration examples of a semiconductor device.

As in a memory portion 14_A illustrated in FIG. 4A, OS transistors or Si transistors can be used as the transistors 17 and 18. Alternatively, as in a memory portion 14_B illustrated in FIG. 4B, only OS transistors can be used as the transistors 17 and 18.

Figure 4B:
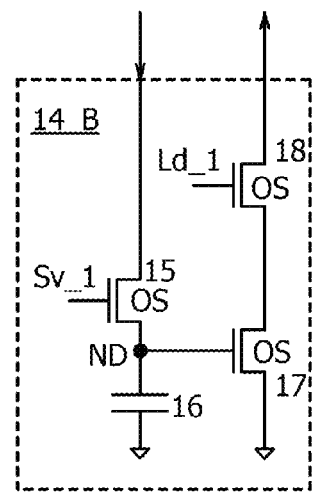
Figure 4C:
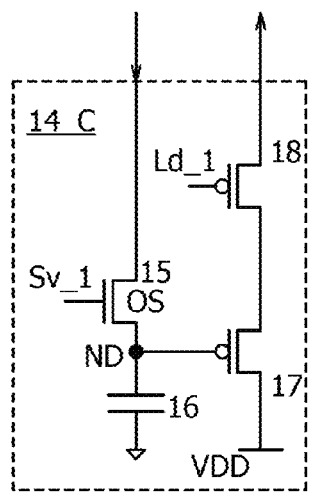
Figure 4D:
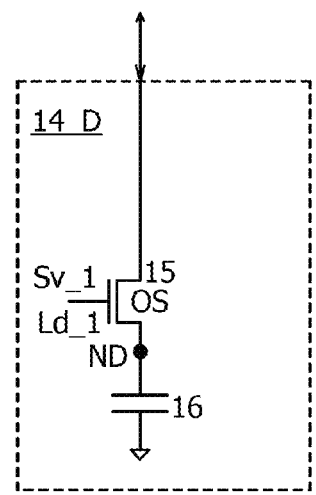

In the case where not the ground potential but a power supply potential VDD is supplied at the time of loading, p-channel transistors can be used as in a memory portion 14_C illustrated in FIG. 4C. In the case where the same path of charges is used for both saving and loading, a memory portion 14_D illustrated in FIG. 4D can be employed.

In the circuit configurations illustrated in FIG. 3 and FIGS. 4A and 4B, a back gate may be added to the transistor 15. By applying a negative potential to the back gate to positively shift the threshold voltage of the transistor 15, the off-state current of the transistor 15 can be kept low. By applying a positive potential to the back gate to negatively shift the threshold voltage of the transistor 15, the on-state current of the transistor 15 can be increased.

Although the structures of the transistors 15, 17, and 18 are not particularly limited, a top-gate structure or a bottom-gate structure can be employed, for example.

The circuit configurations of the plurality of memory portions 14_1 to 14_n having a function of storing data obtained by the arithmetic process of the processor 10 are not limited to those illustrated in FIG. 3 and FIGS. 4A and 4B. For example, the plurality of memory portions 14_1 to 14_n may include a phase-change RAM (PRAM), a phase-change memory (PCM), a resistive RAM (ReRAM), a magnetoresistive RAM (MRAM), or the like. For the MRAM, a magnetic tunnel junction element (also referred to as an MTJ element) can be used, for example.

Next, examples of the operation of the semiconductor device 100 illustrated in FIG. 1 will be described with reference to schematic diagrams of FIGS. 5A and 5B.

Figure 5A:
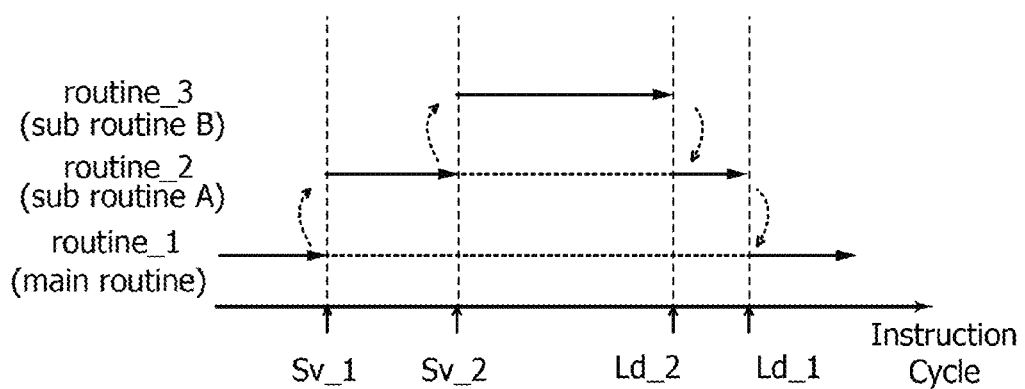
FIGS. 5A and 5B show structure examples of a semiconductor device.
Figure 5B:
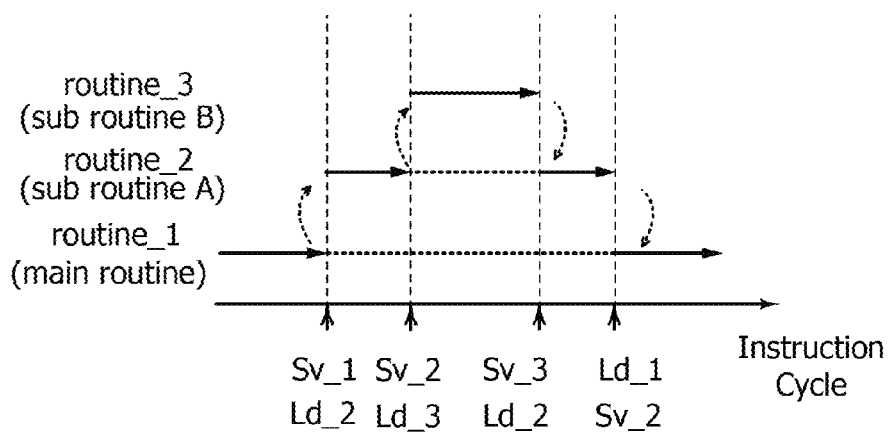

In the examples of the operation of the semiconductor device 100 in FIGS. 5A and 5B, the plurality of routines are first to third routines and the program processing is interrupted by an interrupt signal so that a different routine can be executed. In the following description, the first routine is a main routine, the second routine is a subroutine A, and the third routine is a subroutine B.

First, FIG. 5A is explained. FIG. 5A shows an operation in which the subroutine A interrupts and then the subroutine B interrupts during the program processing of the main routine.

As shown in FIG. 5A, first, instructions are executed in order in the register 12 to execute the program processing of the main routine (expressed by a solid arrow in the drawing). Then, an interrupt signal interrupts the main routine, so that the subroutine A is preferentially executed (expressed by a dotted arrow in the drawing). Because of the interruption of the main routine, data including program execution data which is stored in the memory circuit 13 is saved. The data stored in the memory circuit 13 is saved into the memory portion 14_1 by supplying the signal Sv_1 from the register controller 11 to the memory portion 14_1.

Then, instructions are executed in order in the register 12 to execute the program processing of the subroutine A (expressed by a solid arrow in the drawing). Then, an interrupt signal interrupts the subroutine A, so that the subroutine B is preferentially executed (expressed by a dotted arrow in the drawing). Because of the interruption of the subroutine A, data including program execution data which is stored in the memory circuit 13 is saved. The data stored in the memory circuit 13 is saved into the memory portion 142 by supplying the signal Sv_2 from the register controller 11 to the memory portion 14_2.

Next, to execute the program processing of the subroutine B, instructions are executed in order in the register 12 (expressed by a solid arrow in the drawing). When the program processing of the subroutine B is finished, the interrupted subroutine A is restarted (expressed by a dotted arrow in the drawing). To restart the subroutine A, the data including the program execution data is loaded into the memory circuit 13. The data stored in the memory portion 14_2 is loaded into the memory circuit 13 by supplying the signal Ld_2 from the register controller 11 to the memory portion 14_2.

Next, to execute the interrupted program processing of the subroutine A, instructions are executed in order in the register 12 (expressed by a solid arrow in the drawing). When the program processing of the subroutine A is finished, the interrupted main routine is restarted (expressed by a dotted arrow in the drawing). To restart the main routine, the data including the program execution data is loaded into the memory circuit 13. The data stored in the memory portion 14_1 is loaded into the memory circuit 13 by supplying the signal Ld_1 from the register controller 11 to the memory portion 14_1.

Although FIG. 5A shows a structure for saving data of the interrupted routine and loading the data of the restarting routine, another structure may be employed as well. FIG. 5B shows another structure of the operation. FIG. 5B shows the operation in which the subroutine A interrupts and then the subroutine B interrupts during the program processing of the main routine in the same manner as that of FIG. 5A except that data for executing program processing of the routine is saved into each of the memory portions 14_1 to 14_3 in advance. In this structure, a stack region of an external memory such as an SRAM or a DRAM is first accessed to save the data in advance; thus, by performing saving or loading at the input timing of the interrupt signal, the routine can be switched and the program processing can be executed. In this manner, more efficient data processing can be achieved.

The switching of the routine by the interrupt signal shown in FIG. 5B is described below. To avoid repeated description, the interruption and restart of the main routine and the subroutine are described here.

In FIG. 5B, when the main routine is interrupted by an interrupt signal during the execution of the program processing of the main routine, saving of the data including the program execution data stored in the memory circuit 13 and loading of the data including the program execution data into the memory circuit 13 for executing the subroutine A are performed. To save the data stored in the memory circuit 13 into the memory portion 14_1, the register controller 11 supplies the signal Sv_1 to the memory portion 14_1. In addition, to load the data stored in the memory portion 142 into the memory circuit 13, the register controller 11 supplies the signal Ld_2 to the memory portion 142.

As described above with reference to FIGS. 5A and 5B, the semiconductor device of one embodiment of the present invention can restart the program processing using the interrupted data even when the subroutine A and the subroutine B interrupt during the program processing of the main routine. Since the data for restarting the interrupted routine is stored inside the processor 10, no access to a stack region of an external memory such as an SRAM or a DRAM is required for data saving or loading. Therefore, even when a process of switching from a current routine to a different routine is performed by an interrupt, the data saving or loading process due to the switching can be performed efficiently without causing a lag of memory access or the like.

Figure 6:
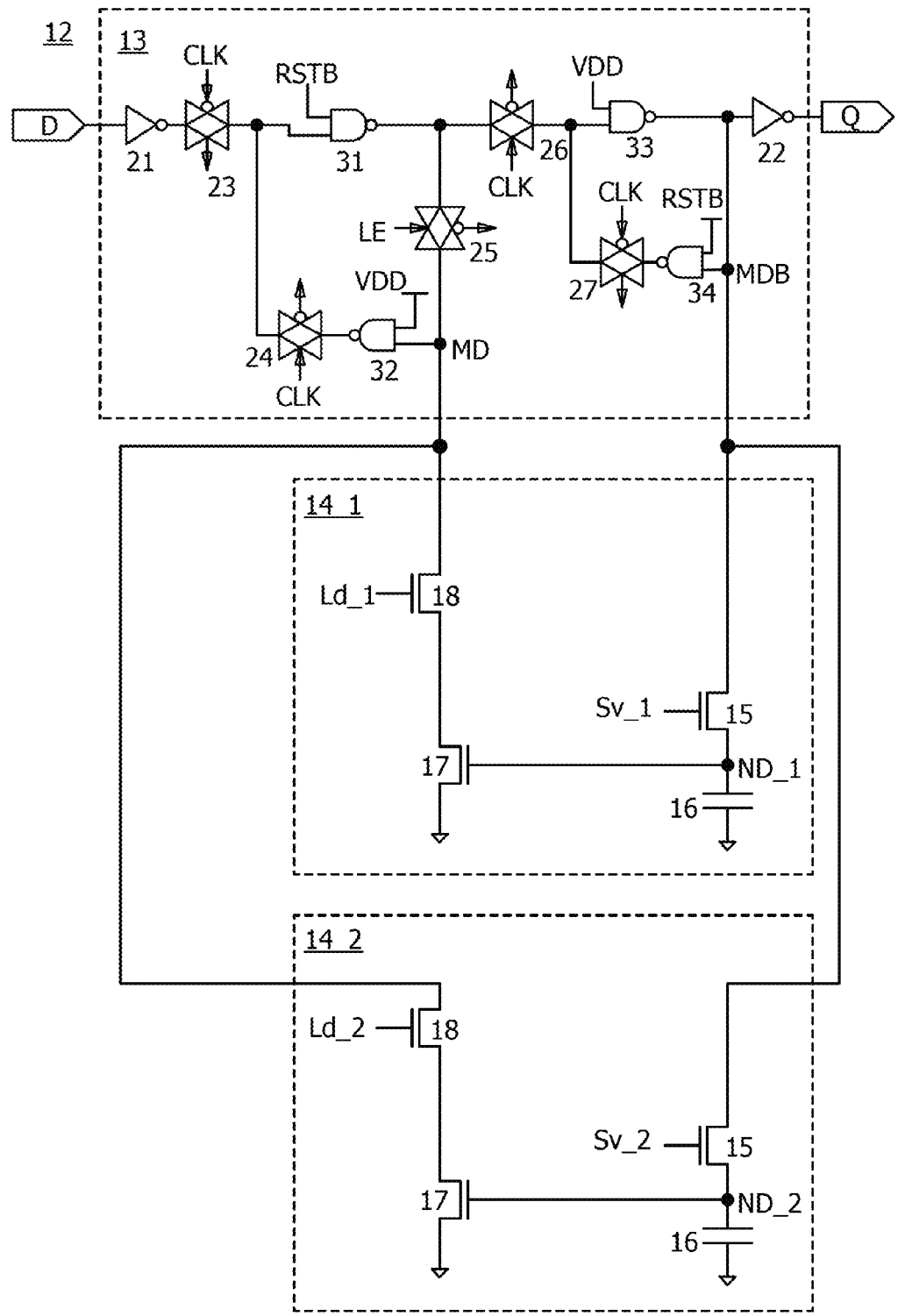
FIG. 6 illustrates a configuration example of a semiconductor device.

Next, a specific circuit configuration of the memory circuit 13 and the plurality of memory portions 14_1 to 14_n is illustrated in FIG. 6. FIG. 6 illustrates the memory portions 14_1 and 14_2 as the plurality of memory portions 14_1 to 14_n.

The memory circuit 13 illustrated in FIG. 6 as an example has a master-slave flip-flop circuit configuration. The memory circuit 13 includes inverters 21 and 22, transmission gates 23 to 27, and NANDs 31 to 34. A signal RSTB is supplied to the NANDs 31 and 34; when the signal RSTB is at H level, the NANDs function as inverters and when the signal RSTB is at L level, the NANDs have high impedance. Note that the NANDs 32 and 33 can be replaced by inverters. Furthermore, a clock signal CLK or a signal LE is supplied to the transmission gates 23 to 27. FIG. 6 can be referred to for the connection relation between circuits.

In the drawing, nodes MD and MDB are included as memory nodes in the memory circuit 13. The nodes MD and MDB hold different logic data from each other. For example, if one of the data is Data, the other is Data_B.

Since the memory portions 14_1 and 14_2 have the same circuit configuration as that in FIG. 3, the description thereof is omitted. Note that a node to which the gate of the transistor 17 included in the memory portion 14_1 is connected is referred to as a node ND_1, and a node to which the gate of the transistor 17 included in the memory portion 14_2 is connected is referred to as a node ND_2.

FIG. 7 is a timing chart of a data saving operation in the circuit illustrated in FIG. 6. As an example, an operation of saving data from the memory circuit 13 into the memory portion 14_1 is shown in FIG. 7. The timing chart of FIG. 7 shows a change of a signal at the node MDB, which is the memory node, and changes of the signal RSTB, the signal LE, a signal CLKin, the signal Sv_1, the signal Ld_1, and the potential of the node ND_1.

Figure 8A:
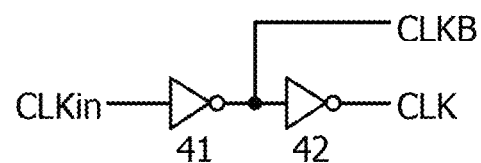
FIGS. 8A to 8C illustrate structure examples of a semiconductor device.

Note that the signal CLKin is a signal for generating the clock signal CLK and an inverted clock signal CLKB. FIG. 8A illustrates an example of a circuit configuration for generating the clock signal CLK and the inverted clock signal CLKB using the signal CLKin. In FIG. 8A, inverters 41 and 42 are used to generate the signals.

Figure 8B:
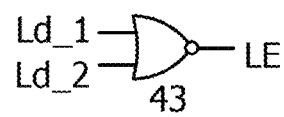
Figure 8C:
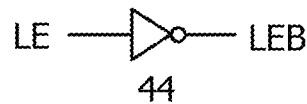

In addition, the signal LE is a signal for bringing the node MD in a floating state at the time of loading data. FIG. 8B illustrates an example of a circuit configuration for generating the signal LE using the signals Ld_1 and Ld_2. In FIG. 8B, a NOR 43 is used to generate the signal. The signal LEB that is an inverted signal of the signal LE can be generated using an inverter 44 as illustrated in FIG. 8C.

At Time t1 in the timing chart of FIG. 7, waveforms and signal states in a normal operation are shown. In the normal operation, data is supplied to the terminal D in the memory circuit and the memory circuit outputs data from the terminal Q in accordance with the input of the clock signal CLK. Data_B is stored at the node MDB. In addition, the signal RSTB and the signal LE are both at H level. The signal Sv_1 and the signal Ld_1 are both at L level. A L level potential is held at the node ND_1 in an initial state.

Next, at Time t2, waveforms and signal states at the time of saving data are shown. The clock signal CLK is fixed and the signal Sv_1 is set to H level. In the example illustrated in FIG. 7, the clock signal CLK is fixed at L level and the signal Sv_1 is set to H level. The voltage amplitude of the signal Sv_1 is preferably set larger than that of the signal Ld_1; with this structure, the potential that is supplied to the node ND_1 and based on Data_B can be prevented from being decreased by the threshold voltage of the transistor 15.

Then, at Time t3, waveforms and signal states in a normal operation again are shown. In the normal operation, data is supplied to the terminal D in the memory circuit and the memory circuit outputs data from the terminal Q in accordance with the input of the clock signal CLK. At the node ND_1, the potential corresponding to Data_B, which is saved at Time t2, is held. In addition, the signal RSTB and the signal LE are both at H level. The signal Sv_1 and the signal Ld_1 are both at L level.

By keeping the L level of the signal Sv_1 after Time t3, charges corresponding to the data potential supplied to the node ND_1 at Time t2 can be kept.

The timing chart for the operation of saving data in the circuit illustrated in FIG. 6 has been described so far.

Next, FIG. 9 is a timing chart of a data loading operation in the circuit illustrated in FIG. 6. As an example, an operation of loading data from the memory portion 14_1 into the memory circuit 13 is shown in FIG. 9. The timing chart of FIG. 9 shows a change of a signal at the node MD, which is the memory node, and changes of the signal RSTB, the signal LE, a signal CLKin, the signal Sv_1, the signal Ld_1, and the potential of the node ND_1.

At Time t4 in the timing chart of FIG. 9, waveforms and signal states in a normal operation are shown. In the normal operation, data is supplied to the terminal D in the memory circuit and the memory circuit outputs data from the terminal Q in accordance with the input of the clock signal CLK. DataA is stored at the node MD. In addition, the signal RSTB and the signal LE are both at H level. The signal Sv_1 and the signal Ld_1 are both at L level. A potential corresponding to Data_B, which is saved at Time t2 in FIG. 7, is held at the node ND_1.

Then, at Time t5, the state in which a precharge operation is performed for data loading is shown. In the precharge operation, the signal CLKin is set at H level, the signal RSTB is set at L level, and the node MD is set at H level.

Next, at Time t6, the state for loading data is shown. In the data loading operation, the signal LE is set at L level to bring the node MD into a floating state, and the signal Ld_1 is set at H level. The on/off states of the transistors 17 and 18 are determined, and the potential of the node MD becomes Data (LOAD) which is the logically inverted data of the data at the node ND_1.

Next, at Time t7, the signal RSTB is set at H level and the signal Ld_1 is set at L level. At Time t8, the signal LE is set at H level to perform a normal operation again.

The timing chart for the operation of loading data in the circuit illustrated in FIG. 6 has been described so far.

Figure 10:
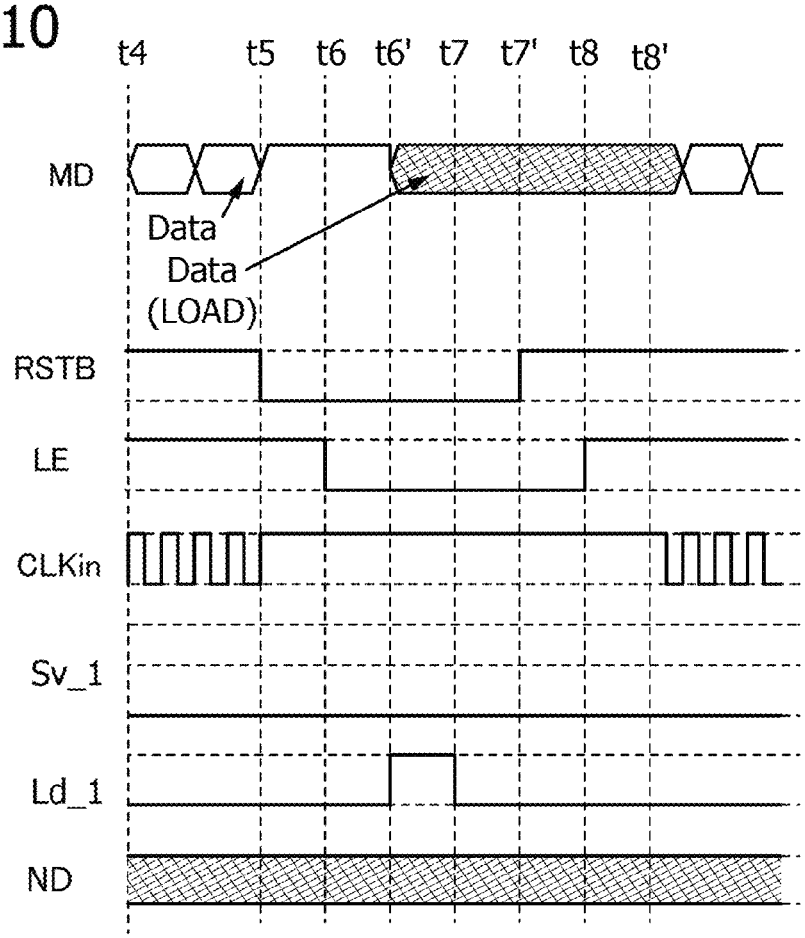
FIG. 10 is a timing chart.

Note that although a plurality of operations are described as being performed at the same time in FIG. 9 (e.g., setting the signal LE at L level and the signal Ld_1 at H level at the same time at Time t6), they may be performed at different times. For example, as shown in FIG. 10, they may be performed at Time t6 and Time t6'. Furthermore, setting the signal RSTB at H level and setting the signal Ld_1 at L level may be performed at different times (e.g., Time t7 and Time t7'). Moreover, setting the signal LE at H level and supplying the signal CLKin may be performed at different times (e.g., Time t8 and Time t8').

In the semiconductor device 100 described in this embodiment, as described above, by the structure of performing saving or loading between the memory circuit 13 and the plurality of memory portions 14_1 to 14_n in accordance with the routine executed in the processor 10, a plurality of routines can interrupt in response to the interrupt signal in data processing in the processor 10. When another routine interrupts, data is saved from the memory circuit 13 into the memory circuit 14 or loaded from the memory circuit 14 into the memory circuit 13; thus, although in-process routine is suspended to execute a different routine by priority, the routine executed immediately before the interrupt can be restarted. Since the data for restarting the interrupted routine is stored inside the processor 10, no access to a stack region of an external memory such as an SRAM or a DRAM is required for data saving or loading. Therefore, even when a process of switching from a current routine to a different routine is performed by an interrupt, the data saving or loading process due to the switching can be performed efficiently without causing a lag of memory access or the like.

The structure described above in this embodiment can be combined as appropriate with any of the structures described in the other embodiments.

Embodiment 2

In this embodiment, a circuit configuration example which is different from that of the memory circuit 13 and the memory portions 14_1 and 14_2 described in Embodiment 1 with reference to FIG. 6 will be described.

Figure 11:
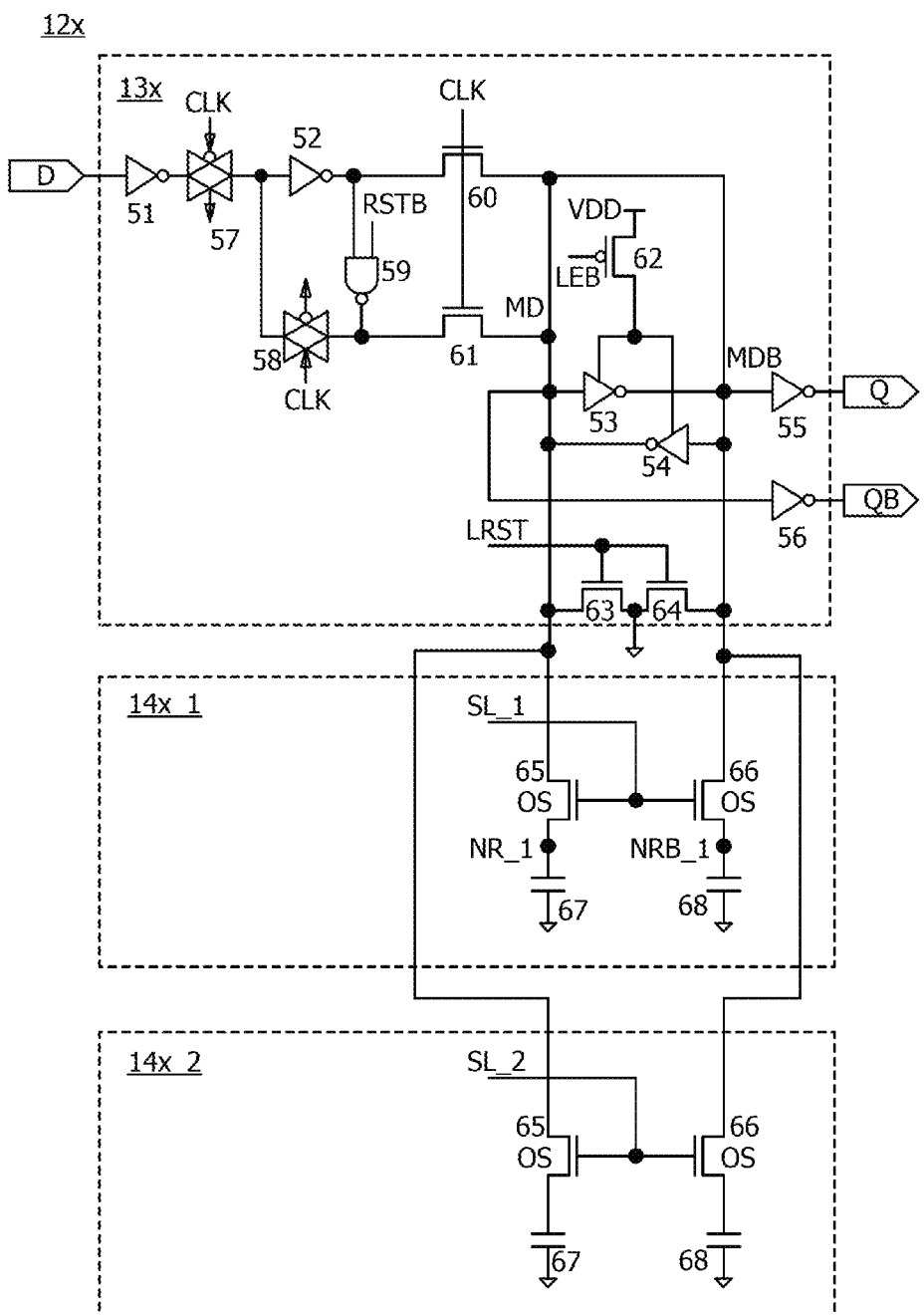
FIG. 11 illustrates a configuration example of a semiconductor device.

FIG. 11 illustrates a circuit configuration including a memory circuit 13x and memory portions 14x_1 and 14x_2, which is the circuit configuration different from that of the memory circuit 13 and the memory portions 14_1 and 14_2 described in Embodiment 1 with reference to FIG. 6. The memory circuit 13x includes inverters 51 to 56, transmission gates 57 and 58, a NAND 59, and transistors 60 to 64. The signal RSTB is supplied to the NAND 59. In addition, a clock signal CLK is supplied to the transmission gates 57 and 58. A clock signal CLK is supplied to the transistors 60 and 61. A signal LEB is supplied to the transistor 62. A signal LRST is supplied to the transistors 63 and 64. FIG. 11 can be referred to for the connection relation between circuits.

In the drawing, nodes MD and MDB are included as memory nodes in the memory circuit 13x. The nodes MD and MDB hold different logic data from each other. For example, if one of the data is Data, the other is Data_B. Note that the signal LRST is a signal for initializing the nodes MD and MDB. The initialization is performed by setting the nodes MD and MDB at a ground potential or the same potential to each other.

The memory portions 14x_1 and 14x_2 each include transistors 65 and 66 and capacitors 67 and 68. A signal SL_1 and a signal SL_2 are supplied to gates of the transistors 65 and 66. The signal SL_1 and the signal SL_2 are signals for saving or loading data between the memory circuit 13x and the plurality of memory portions 14x_1 to 14x_n, and function as the signals Sv_1 to Sv_n and the signals Ld_1 to Ld_n described in Embodiment 1. FIG. 11 can be referred to for the connection relation between circuits. Note that nodes to which one of a source and a drain of the transistor 65 and one of a source and a drain of the transistor 66 in the memory portion 14x_1 are connected are referred to as a node NR_1 and a node NRB_1.

Note that the signal CLKin is the same as the signal CLKin described in Embodiment 1, that is, the signal for generating the clock signal CLK and the inverted clock signal CLKB as illustrated in FIG. 8A.

Note that the transistors 65 and 66 preferably have low off-state current. The transistors with low off-state current are preferably OS transistors. In some circuit diagrams, "OS" is written beside circuit symbols of the transistors 65 and 66 to clearly show that the transistors 65 and 66 are OS transistors.

Figure 12:
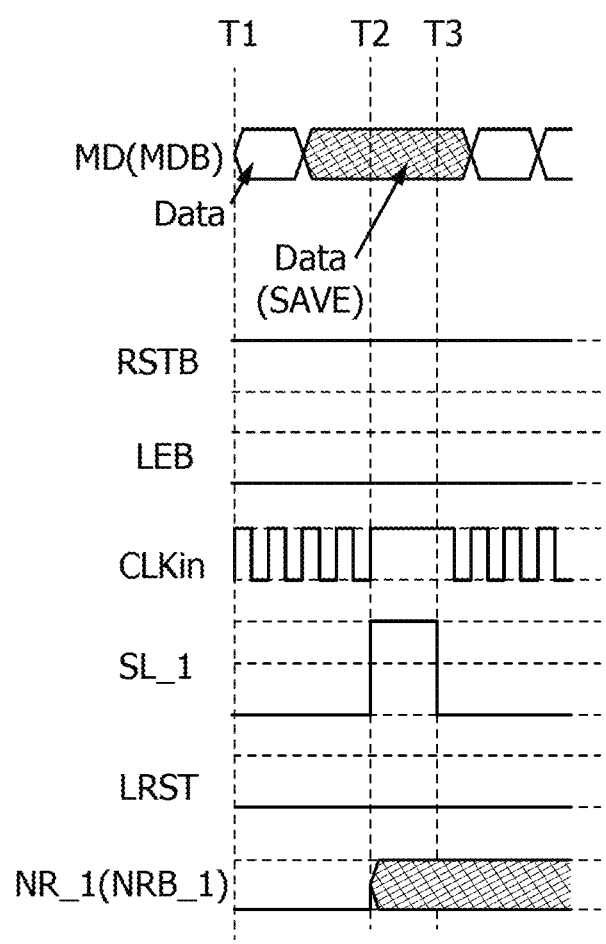
FIG. 12 is a timing chart.

FIG. 12 is a timing chart of a data saving operation in the circuit illustrated in FIG. 11. As an example, an operation of saving data from the memory circuit 13x into the memory portion 14x_1 is shown in FIG. 12. The timing chart of FIG. 12 shows a change of a signal at the node MD(MDB), which is the memory node, and changes of the signal RSTB, the signal LEB, the signal CLKin, the signal SL_1, the signal LRST, and the potential of the node NR_1 (NRB_1).

At Time T1 in the timing chart of FIG. 12, waveforms and signal states in a normal operation are shown. In the normal operation, data is supplied to the terminal D in the memory circuit and the memory circuit outputs data from the terminal Q and a terminal QB in accordance with the input of the clock signal CLK. Data is stored at the node MD. In addition, the signal RSTB is at H level, and the signal LEB is at L level. The signal SL_1 is at L level. The signal LRST is at L level. A L level potential is held at the node NR_1 in an initial state.

Next, at Time T2, waveforms and signal states at the time of saving data are shown. The clock signal CLK is fixed at H level or L level, and the signal SL_1 is set to H level. The voltage amplitude of the signal SL_1 is preferably set larger than those of the other signals; with this structure, the potentials that are supplied to the node NR_1 and NRB_1 and based on Data and Data_B can be prevented from being decreased by the threshold voltages of the transistors 65 and 66.

Then, at Time T3, waveforms and signal states in a normal operation again are shown. In the normal operation, data is supplied to the terminal D in the memory circuit and the memory circuit outputs data from the terminal Q and the terminal QB in accordance with the input of the clock signal CLK. At the nodes NR_1 and NRB_1, the potentials corresponding to Data and Data_B, which are saved at Time T2, are held. In addition, the signal RSTB is at H level, and the signal LEB is at L level. The signal SL_1 is at L level. The signal LRST is at L level.

By keeping the L level of the signal SL_1 after Time T3, charges corresponding to the data potential supplied to the nodes NR_1 and NRB_1 at Time T2 can be kept.

The timing chart for the operation of saving data in the circuit illustrated in FIG. 11 has been described so far.

Figure 13:
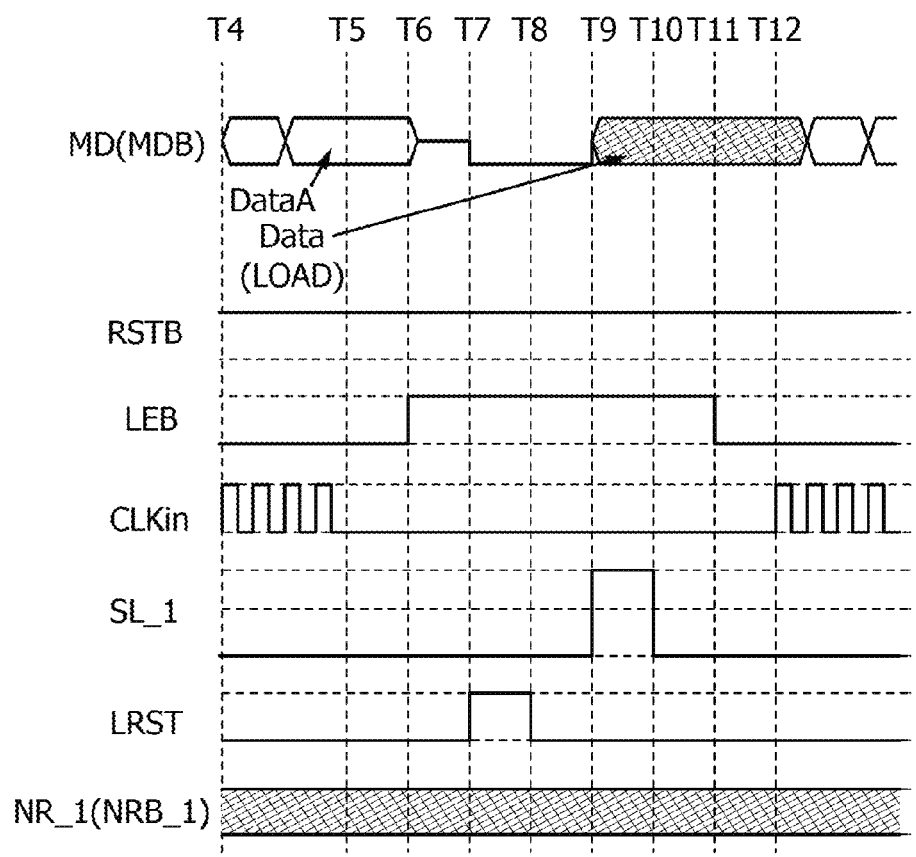
FIG. 13 is a timing chart.

Next, FIG. 13 is a timing chart of a data loading operation in the circuit illustrated in FIG. 11. As an example, an operation of loading data from the memory portion 14x_1 into the memory circuit 13x is shown in FIG. 13. The timing chart of FIG. 13 shows a change of a signal at the node MD(MDB), which is the memory node, and changes of the signal RSTB, the signal LEB, the signal CLKin, the signal SL_1, the signal LRST, and the potential of the node NR_1(NRB_1).

At Time T4 in the timing chart of FIG. 13, waveforms and signal states at the time of performing a normal operation are shown. In the normal operation, data is supplied to the terminal D in the memory circuit and the memory circuit outputs data from the terminal Q and the terminal QB in accordance with the input of the clock signal CLK. DataA is stored at the node MD. In addition, the signal RSTB is at H level, and the signal LEB is at L level. The signal SL_1 is at L level. The signal LRST is at L level. A potential corresponding to Data, which is saved at Time T2 in FIG. 12, is held at the node NR_1.

Next, at Time T5, the signal CLKin is set at L level. At Time T6, the signal LEB is set at H level. The transistors 60 and 61 are brought into an off state, so that the supply of power supply voltage to the inverters 53 and 54 is stopped. Thus, the nodes MD and MDB are brought into a floating state.

Then, at Time T7, the signal LRST is set at H level. At Time T8, the signal LRST is set at L level. The transistors 63 and 64 are brought into an on state and then into an off state. The potentials of the nodes MD and MDB both become a ground potential.

Next, at Time T9 and T10, data is loaded. In the data loading operation, the signal SL_1 is set at H level and then set at L level. The transistors 65 and 66 are brought into an on state and then into an off state. Thus, charges transfer between the node MD and the node NR_1 and between the node MDB and the node NRB_1. One of the node NR_1 and the node NRB_1 holds charges corresponding to the H level potential, and the other holds charges corresponding to the L level potential. Consequently, a potential difference between the node MD and the node MDB is generated. In the state where this difference is generated, the signal LEB is set at L level at Time T11. The supply of the power supply voltage to the inverters 53 and 54 is restarted, and data is loaded into the nodes MD and MDB. At Time T12, the signal LE is set at H level to perform a normal operation again.

The timing chart for the operation of loading data in the circuit illustrated in FIG. 11 has been described so far.

Figure 14:
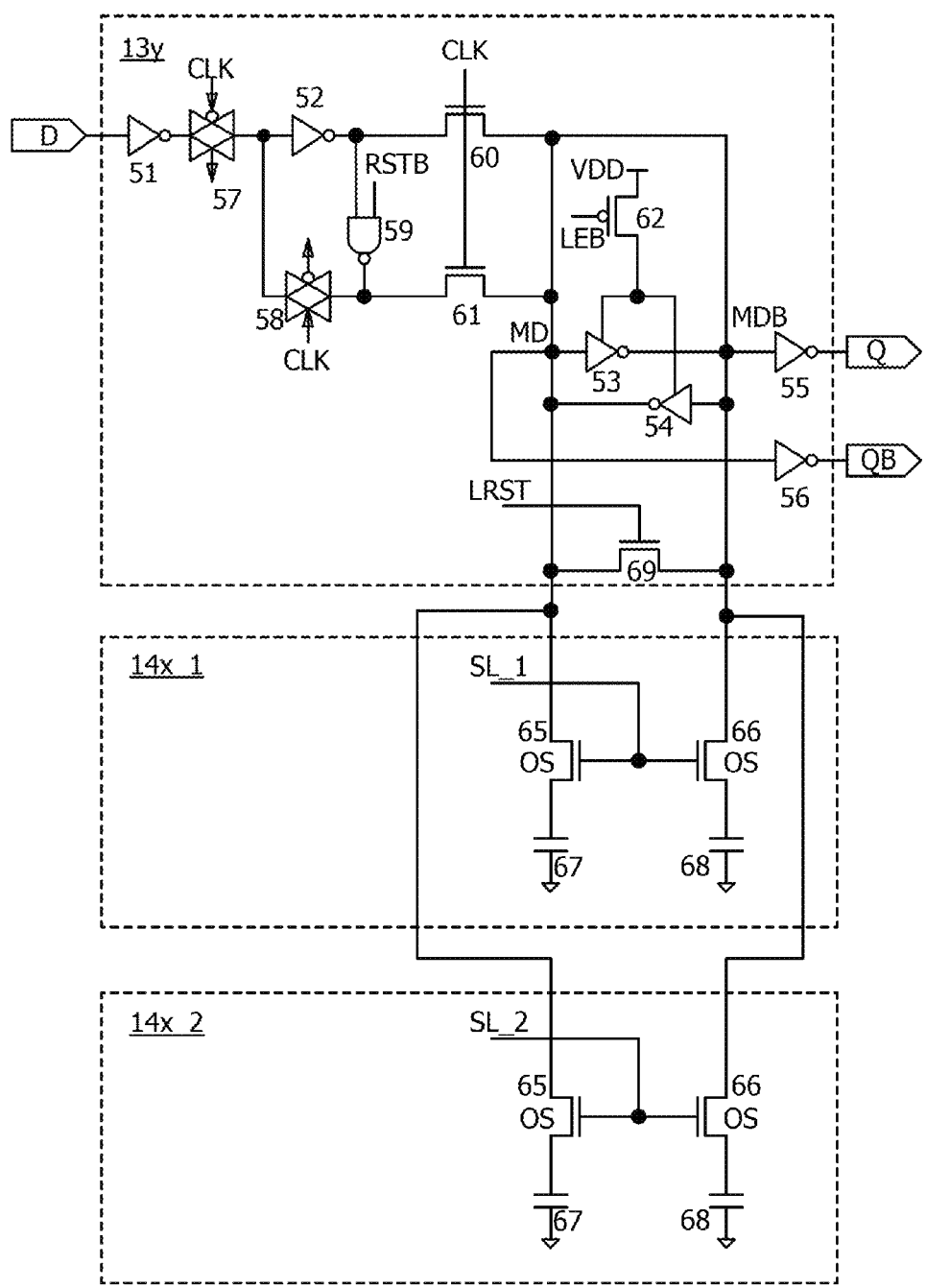
FIG. 14 illustrates a configuration example of a semiconductor device.

Although FIG. 11 shows a circuit configuration in which both the nodes MD and MDB are set at a ground potential by the initialization operation, another structure may be employed as well. For example, a configuration in which the initialization operation is performed by setting the both nodes at the same potential may be employed. An example of the circuit configuration in which the nodes MD and MDB are set at the same potential is illustrated in FIG. 14. A memory circuit 13y illustrated in FIG. 14 includes a transistor 69 for making the nodes MD and MDB at the same potential. The signal LRST is supplied to a gate of the transistor 69, and data saving and loading can be performed by the operation described with reference to FIG. 12 and FIG. 13.

As described above, in the memory circuit 13 and the memory portions 14_1 and 14_2 described in this embodiment, in the same manner as that of the structure described in Embodiment 1, even when a process of switching from a current routine to a different routine is performed by an interrupt, the data saving or loading process due to the switching can be performed efficiently without causing a lag of memory access or the like.

The structure described above in this embodiment can be combined as appropriate with any of the structures described in the other embodiments.

Embodiment 3

In this embodiment, an example of application modes of the semiconductor device will be described.

Figure 15:
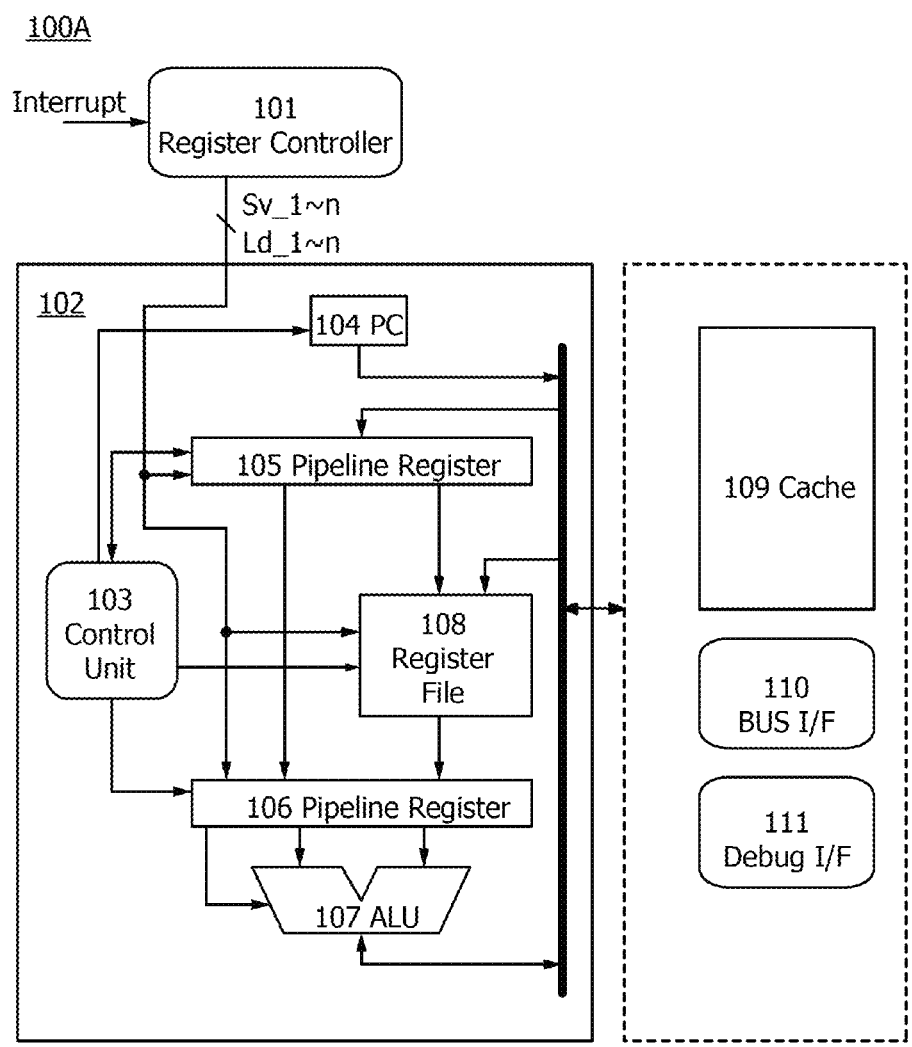
FIG. 15 illustrates a configuration of a semiconductor device.

An example of the configuration of the semiconductor device of one embodiment of the present invention is illustrated in FIG. 15. A semiconductor device 100A illustrated in FIG. 15 includes a register controller 101, a processor 102, a cache 109, a bus interface 110, and a debug interface 111. Furthermore, the processor 102 includes a control unit 103, a program counter (PC) 104, a pipeline register 105, a pipeline register 106, an arithmetic logic unit (ALU) 107, and a register file 108. The semiconductor device of one embodiment of the present invention can be used in the pipeline register 105, the pipeline register 106, the register file 108, and a register, a flip-flop, or the like included in another circuit.

The control unit 103 has functions of decoding and executing instructions contained in a program such as inputted applications by controlling the overall operations of the register controller 101, the PC 104, the pipeline registers 105 and 106, the ALU 107, the register file 108, the cache 109, the bus interface 110, and the debug interface 111.

The ALU 107 has a function of performing a variety of arithmetic processes such as four arithmetic processes and logic operations.

The control unit 103 includes a main memory having a function of storing a program such as an application including a plurality of instructions which are executed in the control unit 103, and data used for the arithmetic process performed by the ALU 107.

The cache 109 has a function of temporarily storing frequently used data. The PC 104 is a register having a function of storing an address of an instruction to be executed next. The pipeline register 105 has a function of temporarily storing frequently used instructions of instructions (programs) used in the control unit 103. Although not illustrated in FIG. 15, the semiconductor device 100 includes a cache controller for controlling the operation of the cache 109.

The register file 108 includes a plurality of registers including a general purpose register and can save data which is read out from the main memory of the control unit 103, data which is obtained during the arithmetic processes in the ALU 107, data which is obtained as a result of the arithmetic processes in the ALU 107, and the like.

The pipeline register 106 has a function of temporarily storing data obtained during arithmetic processes performed by the ALU 107, data obtained as a result of the arithmetic processes by the ALU 107, or the like. The pipeline register 106 may have a function of temporarily storing a program such as an application.

The bus interface 110 functions as a path for data between the semiconductor device 100A and devices outside the semiconductor device. The debug interface 111 functions as a path of a signal for inputting an instruction to control debugging to the semiconductor device 100A. The bus interface 110 and the debug interface 111 are each provided with a register.

The register controller 101 is a circuit having a function of outputting signals for performing saving or loading between the memory circuit 13 and the plurality of memory portions 14_1 to 14_n included in the pipeline register 105, the pipeline register 106, the register file 108, and the like, in response to an interrupt signal. The signals for saving or loading the data are the signals Sv_1 to Sv_n and the signals Ld_1 to Ld_n, which are described in detail in Embodiment 1 and not described here.

An example of the flow of the data saving or loading operation between the memory circuit 13 and the plurality of memory portions 14_1 to 14_n in the semiconductor device 100A having the above-described structure will be described.

First, an interrupt signal is supplied to the register controller 101. The register controller 101 saves the data stored in the memory circuit 13 into any of the plurality of memory portions 14_1 to 14_n that corresponds to the routine that is under execution of the program processing. Then, if necessary, program processing of the routine that is given a higher priority by the interrupt operation is executed. At this time, if necessary, data in the corresponding memory portion among the plurality of memory portions 14_1 to 14_n may be loaded into the memory circuit 13. After the completion of the higher-priority routine, the data for the previous routine is loaded to execute program processing.

Since the data for restarting the interrupted routine is stored inside the processor 102, no access to a stack region of an external memory such as an SRAM or a DRAM is required for data saving or loading. Therefore, even when a process of switching from a current routine to a different routine is performed by an interrupt, the data saving or loading process due to the switching can be performed efficiently without causing a lag of memory access or the like.

The structure described above in this embodiment can be combined as appropriate with any of the structures described in the other embodiments.

Embodiment 4

In this embodiment, an example of a cross-sectional structure of transistors included in a semiconductor device will be described.

Figure 16:
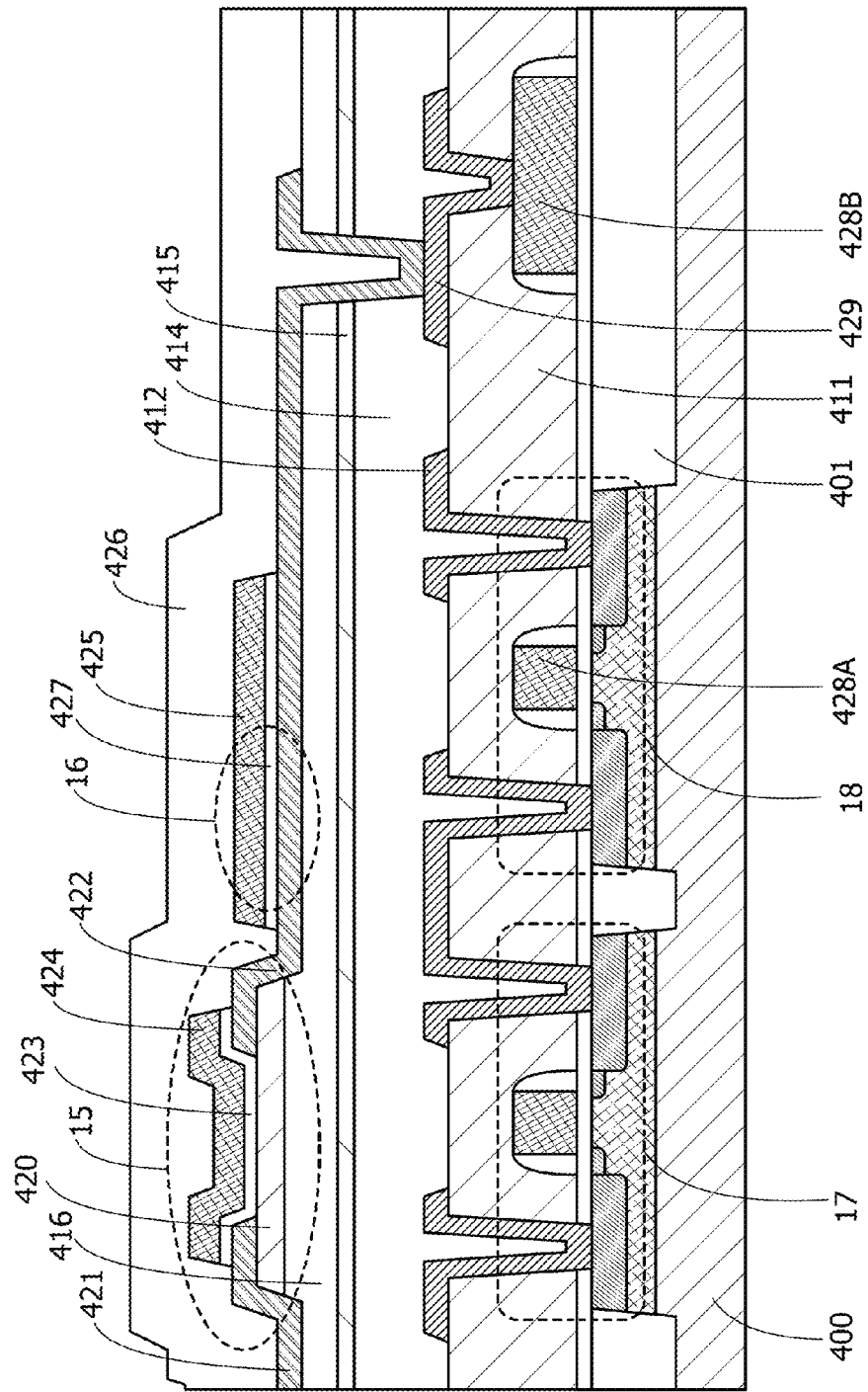
FIG. 16 illustrates a cross-sectional structure of a semiconductor device.

FIG. 16 illustrates an example of a cross-sectional structure of a semiconductor device. FIG. 16 exemplifies cross-sectional structures of the transistors 15, 17, and 18 and the capacitor 16 illustrated in FIG. 4A in Embodiment 1.

In FIG. 16, the transistor 15 having a channel formation region in an oxide semiconductor film and the capacitor 16 are formed over the n-channel transistors 17 and 18 each having a channel formation region in a single crystal silicon substrate.

The transistors 17 and 18 may each have a channel formation region in a semiconductor film or a semiconductor substrate of silicon, germanium, or the like in an amorphous, microcrystalline, polycrystalline, or single crystal state. Alternatively, the transistors 17 and 18 may each have the channel formation region in an oxide semiconductor film or an oxide semiconductor substrate. In the case where channel formation regions of all the transistors are included in an oxide semiconductor film or an oxide semiconductor substrate, the transistor 15 is not necessarily stacked over the transistors 17 and 18, and all the transistors may be formed in the same layer.

In the case where the transistors 17 and 18 are formed using a thin silicon film, any of the following can be used: amorphous silicon formed by sputtering or vapor phase growth such as plasma CVD; polycrystalline silicon obtained by crystallization of amorphous silicon by treatment such as laser annealing; single crystal silicon obtained by separation of a surface portion of a single crystal silicon wafer by implantation of hydrogen ions or the like into the silicon wafer; and the like.

A semiconductor substrate 400 where the transistors 17 and 18 are formed can be, for example, a silicon substrate, a germanium substrate, or a silicon germanium substrate. In FIG. 16, a single crystal silicon substrate is used as the semiconductor substrate 400.

The transistors 17 and 18 are electrically isolated from each other by an element isolation method. As the element isolation method, a local oxidation of silicon (LOCOS) method, a shallow trench isolation (STI) method, or the like can be employed. In FIG. 16, an example in which the trench isolation method is used to electrically isolate the transistors 17 and 18 is shown. Specifically, in the example illustrated in FIG. 16, to electrically isolate the transistors 17 and 18, after trenches are formed in the semiconductor substrate 400 by etching or the like, element separation regions 401 are formed by embedding an insulating material such as silicon oxide in the trenches.

An insulating film 411 is provided over the transistors 17 and 18. Openings are formed in the insulating film 411. In the openings, a plurality of conductive films 412 each connected to any of the sources and drains of the transistors 17 and 18 and a conductive film 429 connected to a conductive film 428B that is in the same layer as a gate 428A of the transistor 18 are provided over the insulating film 411.

An insulating film 414 is provided over the insulating film 411. An insulating film 415 having an effect of blocking diffusion of oxygen, hydrogen, and water is provided over the insulating film 414. As the insulating film 415 has higher density and becomes denser or has a fewer dangling bonds and becomes more chemically stable, the insulating film 415 has a higher blocking effect. The insulating film 415 that has the effect of blocking diffusion of oxygen, hydrogen, and water can be formed using a film formed of aluminum oxide, aluminum oxynitride, gallium oxide, gallium oxynitride, yttrium oxide, yttrium oxynitride, hafnium oxide, hafnium oxynitride, or the like, for example. The insulating film 415 having an effect of blocking diffusion of hydrogen and water can be formed using a film formed of silicon nitride, silicon nitride oxide, or the like, for example.

An insulating film 416 is provided over the insulating film 415, and the transistor 15 is provided over the insulating film 416.

The transistor 15 includes an oxide semiconductor film 420 over the insulating film 416; a conductive film 421 and a conductive film 422 that are connected to the oxide semiconductor film 420 and serve as a source and a drain; an insulating film 423 over the oxide semiconductor film 420 and the conductive films 421 and 422; and a conductive film 424 overlapping with the oxide semiconductor film 420 with the insulating film 423 positioned therebetween. An opening is provided in the insulating films 414 to 416. In the opening, the conductive film 422 is connected to the conductive film 412 that is over the insulating film 411 and is connected to the conductive film 429.

An insulating film 427 is provided over the conductive film 422. A conductive film 425 is provided over the insulating film 427 to overlap with the conductive film 422. A portion in which the conductive film 422, the insulating film 427, and the conductive film 425 overlap with one another serves as the capacitor 16.

An insulating film 426 is provided over the transistors 15 and the capacitor 16.

The structure described above in this embodiment can be combined as appropriate with any of the structures described in the other embodiments.

Embodiment 5

In this embodiment, an example of a transistor that can be used in the semiconductor device of one embodiment of the present invention will be described. In particular, an example of the transistor 15 described with reference to FIG. 16 will be described in this embodiment. Since the transistor 15 having a channel formation region in an oxide semiconductor film has a low off-state current, it can retain charges corresponding to data for a long time.

Figure 17A:
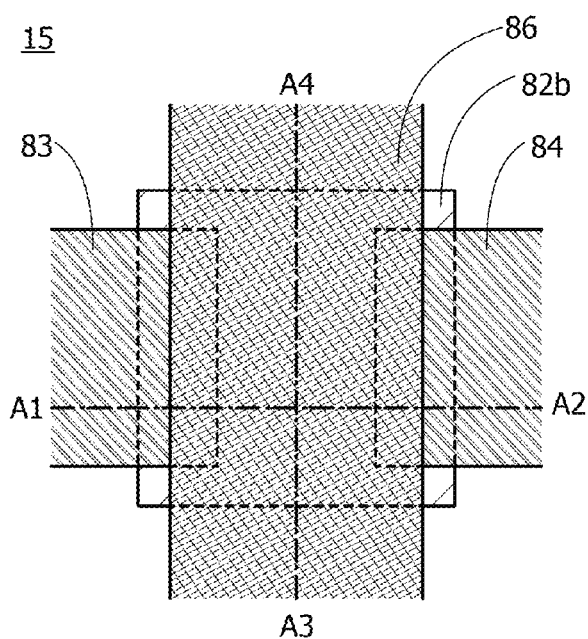
FIGS. 17A to 17C illustrate a structure of a transistor.
Figure 17C:
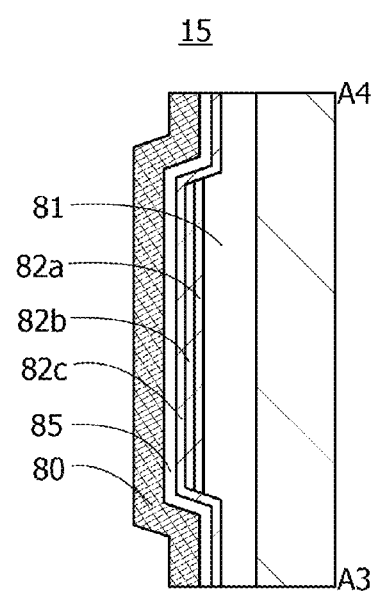
Figure 17B:
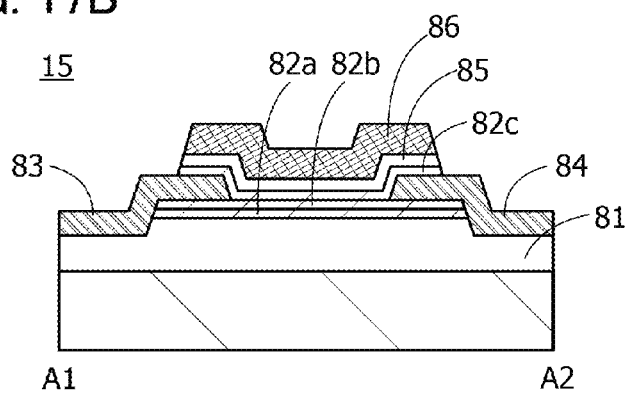

FIGS. 17A to 17C illustrate a structure example of the transistor 15 having a channel formation region in an oxide semiconductor film. FIG. 17A is a top view of the transistor 15. Note that insulating films are not illustrated in FIG. 17A in order to clarify the layout of the transistor 15. FIG. 17B is a cross-sectional view along the dashed-dotted line A1-A2 in the top view of FIG. 17A. FIG. 17C is a cross-sectional view along the dashed-dotted line A3-A4 in the top view of FIG. 17A.

As illustrated in FIGS. 17A to 17C, the transistor 15 includes an oxide semiconductor film 82a and an oxide semiconductor film 82b that are stacked in this order over an insulating film 81; a conductive film 83 and a conductive film 84 that are electrically connected to the oxide semiconductor film 82b and function as a source electrode and a drain electrode; an oxide semiconductor film 82c over the oxide semiconductor film 82b, the conductive film 83, and the conductive film 84; an insulating film 85 that functions as an insulating film and is located over the oxide semiconductor film 82c; and a conductive film 86 that functions as a gate electrode, lies over the insulating film 85, and overlaps with the oxide semiconductor films 82a to 82c.

Figure 18A:
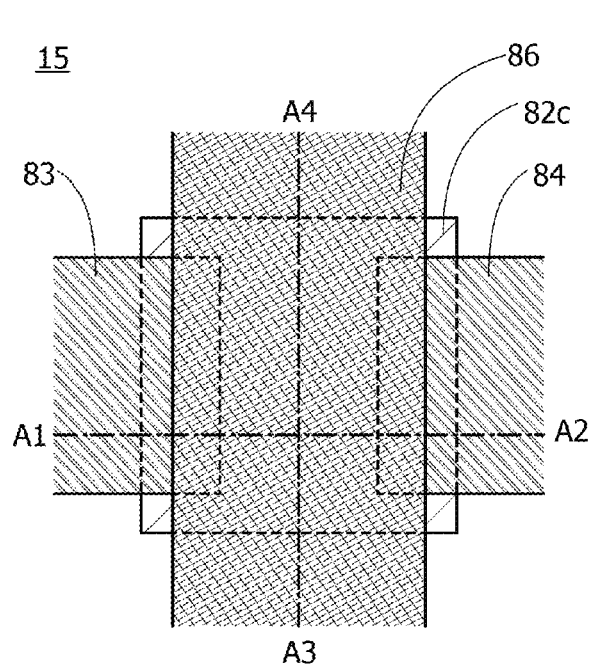
FIGS. 18A to 18C illustrate a structure of a transistor.
Figure 18C:
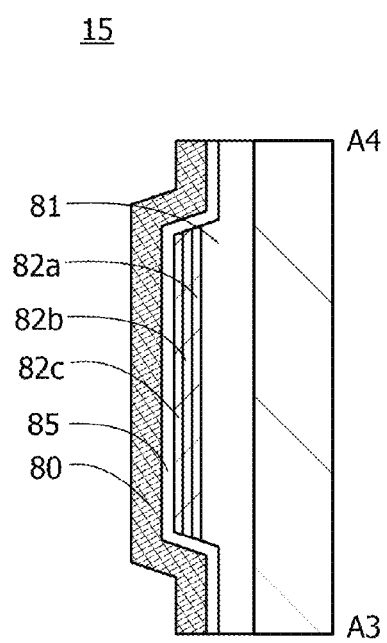
Figure 18B:
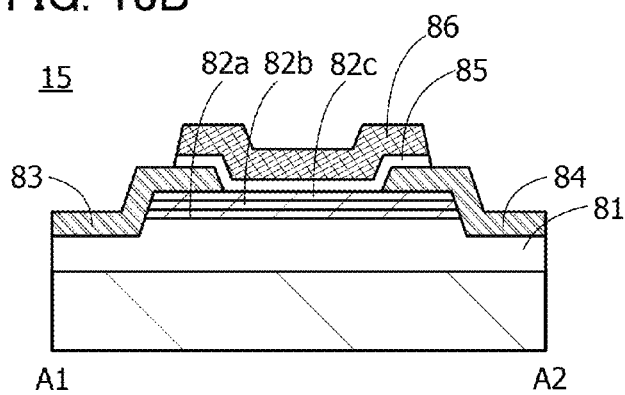

FIGS. 18A to 18C illustrate another specific example of the structure of the transistor 15. FIG. 18A is a top view of the transistor 15. Note that insulating films are not illustrated in FIG. 18A in order to clarify the layout of the transistor 15. FIG. 18B is a cross-sectional view along the dashed-dotted line A1-A2 in the top view of FIG. 18A. FIG. 18C is a cross-sectional view along the dashed-dotted line A3-A4 in the top view of FIG. 18A.

As illustrated in FIGS. 18A to 18C, the transistor 15 includes the oxide semiconductor films 82a to 82c that are stacked in this order over the insulating film 81; the conductive films 83 and 84 that are electrically connected to the oxide semiconductor film 82c and function as a source electrode and a drain electrode; the insulating film 85 that functions as an insulating film and is located over the oxide semiconductor film 82c, the conductive film 83, and the conductive film 84; and the conductive film 86 that functions as a gate electrode, is over the insulating film 85, and overlaps with the oxide semiconductor films 82a to 82c.

Figure 21A:
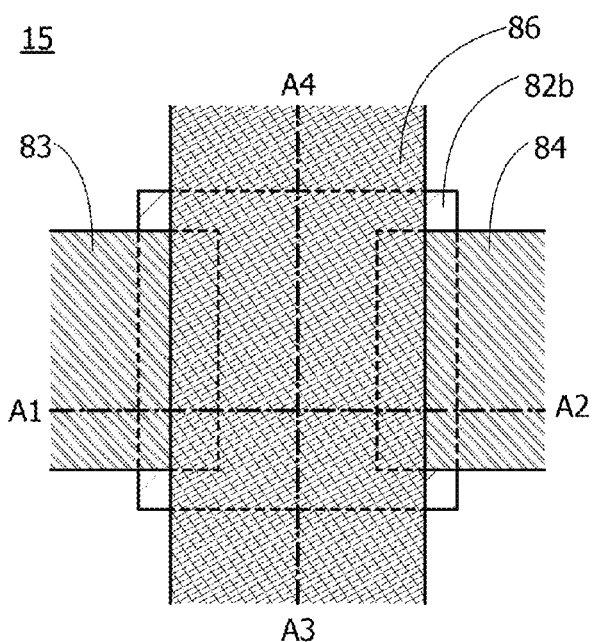
FIGS. 21A to 21C illustrate a structure of a transistor.
Figure 21C:
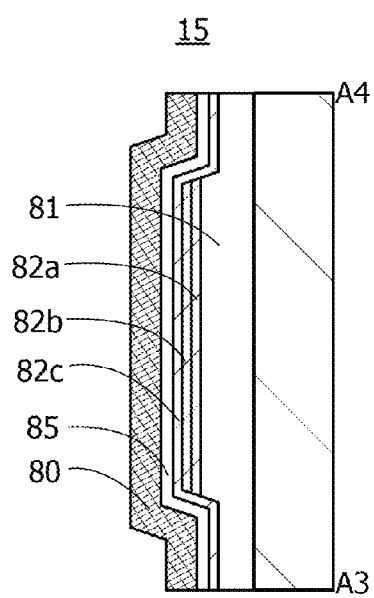
Figure 21B:
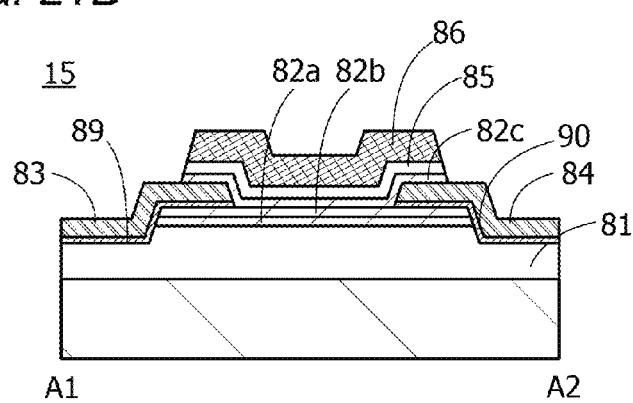

FIGS. 21A to 21C illustrate another specific example of the structure of the transistor 15. FIG. 21A is a top view of the transistor 15. Note that insulating films are not illustrated in FIG. 21A in order to clarify the layout of the transistor 15. FIG. 21B is a cross-sectional view along the dashed-dotted line A1-A2 in the top view of FIG. 21A. FIG. 21C is a cross-sectional view along the dashed-dotted line A3-A4 in the top view of FIG. 21A.

As illustrated in FIGS. 21A to 21C, the transistor 15 includes the oxide semiconductor films 82a to 82c that are stacked in this order over the insulating film 81; the conductive films 83, 84, 89, and 90 that are electrically connected to the oxide semiconductor film 82c and function as a source electrode and a drain electrode; the insulating film 85 that functions as an insulating film and is located over the oxide semiconductor film 82c, the conductive film 83, and the conductive film 84; and the conductive film 86 that functions as a gate electrode, is over the insulating film 85, and overlaps with the oxide semiconductor films 82a to 82c.

The layers 89 and 90 are layers having a function of not forming a Schottky barrier with the oxide semiconductor films 82a to 82c and the like. For example, these layers are layers of a transparent conductor, an oxide semiconductor, a nitride semiconductor, or an oxynitride semiconductor. More specifically, the layers 89 and 90 may be formed using a layer containing indium, tin, and oxygen, a layer containing indium and zinc, a layer containing indium, tungsten, and zinc, a layer containing tin and zinc, a layer containing zinc and gallium, a layer containing zinc and aluminum, a layer containing zinc and fluorine, a layer containing zinc and boron, a layer containing tin and antimony, a layer containing tin and fluorine, a layer containing titanium and niobium, or the like. Alternatively, any of these layers may contain hydrogen, carbon, nitrogen, silicon, germanium, or argon. With the structure including the layers 89 and 90, on-state characteristics of the transistor can be improved.

FIGS. 17A to 17C and FIGS. 18A to 18C each illustrate the structure example of the transistor 15 in which the oxide semiconductor films 82a to 82c are stacked. However, the structure of the oxide semiconductor film included in the transistor 15 is not limited to a stacked-layer structure including a plurality of oxide semiconductor films and may be a single-layer structure.

In the case where the transistor 15 includes the oxide semiconductor films 82a to 82c stacked in this order, each of the oxide semiconductor films 82a and 82c is an oxide film that contains at least one of metal elements contained in the oxide semiconductor film 82b and in which the conduction band minimum is closer to the vacuum level than that in the oxide semiconductor film 82b is by higher than or equal to 0.05 eV, 0.07 eV, 0.1 eV, or 0.15 eV and lower than or equal to 2 eV, 1 eV, 0.5 eV, or 0.4 eV. The oxide semiconductor film 82b preferably contains at least indium because carrier mobility is increased.

In the case where the transistor 15 includes the semiconductor films with the above structure, when an electric field is applied to the semiconductor films by applying voltage to the gate electrode, a channel region is formed in the oxide semiconductor film 82b, which has the lowest conduction band minimum among the semiconductor films. That is, the oxide semiconductor film 82c provided between the oxide semiconductor film 82b and the insulating film 85 makes it possible to form the channel region in the oxide semiconductor film 82b, which is separated from the insulating film 85.

Since the oxide semiconductor film 82c contains at least one of the metal elements contained in the oxide semiconductor film 82b, interface scattering is less likely to occur at the interface between the oxide semiconductor film 82b and the oxide semiconductor film 82c. Thus, the movement of carriers is less likely to be inhibited at the interface, which results in an increase in the field-effect mobility of the transistor 15.

In the case where gallium oxide is used for the oxide semiconductor film 82c, indium in the oxide semiconductor film 82b can be prevented from being diffused into the insulating film 85; thus, the leakage current of the transistor 15 can be reduced.

When an interface level is formed at the interface between the oxide semiconductor film 82b and the oxide semiconductor film 82a, a channel region is formed also in the vicinity of the interface, which causes a change in the threshold voltage of the transistor 15. However, since the oxide semiconductor film 82a contains at least one of the metal elements contained in the oxide semiconductor film 82b, an interface level is less likely to be formed at the interface between the oxide semiconductor film 82b and the oxide semiconductor film 82a. Accordingly, the above structure allows reducing of variations in the electrical characteristics of the transistor 15, such as the threshold voltage.

Further, it is preferable that a plurality of oxide semiconductor films be stacked so that an interface level due to an impurity existing between the oxide semiconductor films, which inhibits carrier flow, is not formed at the interface between the oxide semiconductor films. This is because when an impurity exists between the stacked oxide semiconductor films, the continuity of the conduction band minimum between the oxide semiconductor films is lost, and carriers are trapped or disappear by recombination in the vicinity of the interface. By reducing an impurity existing between the films, a continuous junction (here, in particular, a U-shape well structure whose conduction band minimum is changed continuously between the films) is formed more easily than the case of merely stacking a plurality of oxide semiconductor films which contain at least one metal in common as a main component.

In order to form such a continuous junction, the films need to be stacked successively without being exposed to the air by using a multi-chamber deposition system (sputtering apparatus) provided with a load lock chamber. Each chamber of the sputtering apparatus is preferably evacuated to a high vacuum (to approximately $5\times10^{-7}$ Pa to $1\times10^{-4}$ Pa) by an adsorption vacuum pump such as a cryopump so that water and the like acting as impurities for the oxide semiconductor are removed as much as possible. Alternatively, a turbo molecular pump and a cold trap are preferably used in combination to prevent backflow of gas into the chamber through an evacuation system.

To obtain a highly purified intrinsic oxide semiconductor, not only high vacuum evacuation of the chambers but also high purification of a gas used in the sputtering is important. When an oxygen gas or an argon gas used as the above gas has a dew point of −40° C. or lower, preferably −80° C. or lower, further preferably −100° C. or lower and is highly purified, moisture and the like can be prevented from entering the oxide semiconductor film as much as possible. Specifically, in the case where the oxide semiconductor film 82b is an In-M-Zn oxide film (M is Ga, Y, Zr, La, Ce, or Nd) and a target having the atomic ratio of metal elements of In:M:Zn=$x_1$:$y_1$:$z_1$ is used for forming the oxide semiconductor film 82b, $x_1/y_1$ is preferably greater than or equal to ⅓ and less than or equal to 6, further preferably greater than or equal to 1 and less than or equal to 6, and $z_1/y_1$ is preferably greater than or equal to ⅓ and less than or equal to 6, further preferably greater than or equal to 1 and less than or equal to 6. Note that when $z_1/y_1$ is greater than or equal to 1 and less than or equal to 6, a CAAC-OS film to be described later as the oxide semiconductor film 82b is easily formed. Typical examples of the atomic ratio of the metal elements of the target are In:M:Zn=1:1:1 and In:M:Zn=3:1:2.

Specifically, in the case where the oxide semiconductor films 82a and 82c contain an In-M-Zn oxide (M is Ga, Y, Zr, La, Ce, or Nd), it is preferable that $x_2/y_2 < x_1/y_1$ be satisfied and $z_2/y_2$ be greater than or equal to ⅓ and less than or equal to 6, further preferably greater than or equal to 1 and less than or equal to 6 when the atomic ratio of metal elements of In to M and Zn in a target for forming the oxide semiconductor films 82a and 82c is $x_2$:$y_2$:$z_2$. Note that when $z_2/y_2$ is greater than or equal to 1 and less than or equal to 6, CAAC-OS films as the oxide semiconductor films 82a and 82c are easily formed. Typical examples of the atomic ratio of metal elements of In to M and Zn in the target include 1:3:2, 1:3:4, 1:3:6, and 1:3:8.

The oxide semiconductor films 82a and 82c each have a thickness greater than or equal to 3 nm and less than or equal to 100 nm, preferably greater than or equal to 3 nm and less than or equal to 50 nm. The thickness of the oxide semiconductor film 82b is greater than or equal to 3 nm and less than or equal to 200 nm, preferably greater than or equal to 3 nm and less than or equal to 100 nm, further preferably greater than or equal to 3 nm and less than or equal to 50 nm.

The three oxide semiconductor films (the oxide semiconductor films 82a to 82c) can be either amorphous or crystalline. However, when the oxide semiconductor film 82b where a channel region is formed is crystalline, the transistor 15 can have stable electrical characteristics; therefore, the oxide semiconductor film 82b is preferably crystalline.

Note that a channel formation region refers to a region of the semiconductor film of the transistor 15 that overlaps with the gate electrode and is located between the source electrode and the drain electrode. A channel region refers to a region through which current mainly flows in the channel formation region.

For example, when an In—Ga—Zn oxide film formed by a sputtering method is used as each of the oxide semiconductor films 82a and 82c, the oxide semiconductor films 82a and 82c can be deposited with the use of an In—Ga—Zn oxide target containing In, Ga, and Zn in an atomic ratio of 1:3:2. The deposition conditions can be as follows: an argon gas (flow rate: 30 sccm) and an oxygen gas (flow rate: 15 sccm) are used as the deposition gas; the pressure is 0.4 Pa; the substrate temperature is 200° C.; and the DC power is 0.5 kW.

Further, in the case where the oxide semiconductor film 82b is a CAAC-OS film, the oxide semiconductor film 82b is preferably deposited with use of a polycrystalline target including an In—Ga—Zn oxide (In:Ga:Zn=1:1:1 in an atomic ratio). The deposition conditions can be as follows: an argon gas (flow rate: 30 sccm) and an oxygen gas (flow rate: 15 sccm) are used as the deposition gas; the pressure is 0.4 Pa; the substrate temperature is 300° C.; and the DC power is 0.5 kW.

There are few carrier generation sources in a highly purified oxide semiconductor (purified oxide semiconductor) obtained by reduction of impurities such as moisture and hydrogen serving as electron donors (donors) and reduction of oxygen vacancies; therefore, the highly purified oxide semiconductor can be an intrinsic (i-type) semiconductor or a substantially i-type semiconductor. For this reason, a transistor having a channel formation region in a highly purified oxide semiconductor film has extremely small off-state current and high reliability. Thus, a transistor having a channel formation region in the oxide semiconductor film easily has an electrical characteristic of positive threshold voltage (also referred to as a normally-off characteristic).

Specifically, various experiments can prove small off-state current of a transistor having a channel formation region in a highly purified oxide semiconductor. For example, even when an element has a channel width of $1\times10^6$ μm and a channel length of 10 μm, off-state current can be less than or equal to the measurement limit of a semiconductor parameter analyzer, i.e., less than or equal to $1\times10^{-13}$ A, at voltage (drain voltage) between the source electrode and the drain electrode of 1 V to 10 V. In that case, it can be seen that off-state current normalized on the channel width of the transistor is lower than or equal to 100 zA/μm. In addition, a capacitor and a transistor are connected to each other and the off-state current is measured with a circuit in which charge flowing into or from the capacitor is controlled by the transistor. In the measurement, a highly-purified oxide semiconductor film was used for a channel formation region of the transistor, and the off-state current of the transistor was measured from a change in the amount of charge in the capacitor per unit hour. As a result, it was found that, in the case where the voltage between the source electrode and the drain electrode of the transistor is 3 V, a lower off-state current of several tens of yA/μm is obtained. Accordingly, the off-state current of the transistor in which the purified oxide semiconductor film is used as a channel formation region is considerably lower than that of a transistor in which silicon having crystallinity is used.

In the case where an oxide semiconductor film is used as the semiconductor film, at least indium (In) or zinc (Zn) is preferably included as an oxide semiconductor. As a stabilizer for reducing variation in electrical characteristics of a transistor using the oxide semiconductor, gallium (Ga) is preferably additionally contained. Tin (Sn) is preferably contained as a stabilizer. Hafnium (Hf) is preferably contained as a stabilizer. Aluminum (Al) is preferably contained as a stabilizer. Zirconium (Zr) is preferably contained as a stabilizer.

Among the oxide semiconductors, unlike silicon carbide, gallium nitride, or gallium oxide, an In—Ga—Zn oxide, an In—Sn—Zn oxide, or the like has an advantage of high mass productivity because a transistor with favorable electrical characteristics can be formed by sputtering or a wet process. Further, unlike silicon carbide, gallium nitride, or gallium oxide, with the use of the In—Ga—Zn oxide, a transistor with favorable electrical characteristics can be formed over a glass substrate. Further, a larger substrate can be used.

As another stabilizer, one or more kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, any of the following oxides can be used, for example: indium oxide, gallium oxide, tin oxide, zinc oxide, In—Zn oxide, Sn—Zn oxide, Al—Zn oxide, Zn—Mg oxide, Sn—Mg oxide, In—Mg oxide, In—Ga oxide, In—Ga—Zn oxide (also referred to as IGZO), In—Al—Zn oxide, In—Sn—Zn oxide, Sn—Ga—Zn oxide, Al—Ga—Zn oxide, Sn—Al—Zn oxide, In—Hf—Zn oxide, In—La—Zn oxide, In—Pr—Zn oxide, In—Nd—Zn oxide, In—Ce—Zn oxide, In—Sm—Zn oxide, In—Eu—Zn oxide, In—Gd—Zn oxide, In—Tb—Zn oxide, In—Dy—Zn oxide, In—Ho—Zn oxide, In—Er—Zn oxide, In—Tm—Zn oxide, In—Yb—Zn oxide, In—Lu—Zn oxide, In—Sn—Ga—Zn oxide, In—Hf—Ga—Zn oxide, In—Al—Ga—Zn oxide, In—Sn—Al—Zn oxide, In—Sn—Hf—Zn oxide, and In—Hf—Al—Zn oxide.

Note that, for example, an In—Ga—Zn oxide means an oxide containing In, Ga, and Zn and there is no particular limitation on the ratio of In:Ga:Zn. Further, the In—Ga—Zn oxide may contain a metal element other than In, Ga, and Zn. The In—Ga—Zn oxide has sufficiently high resistance when no electric field is applied thereto, so that off-state current can be sufficiently reduced. Further, the In—Ga—Zn oxide has high mobility.

For example, with an In—Sn—Zn oxide, high mobility can be realized relatively easily. However, even with an In—Ga—Zn oxide, mobility can be increased by reducing the defect density in the bulk.

Furthermore, in the transistor 15, a metal in the source electrode and the drain electrode might extract oxygen from the oxide semiconductor film depending on a conductive material used for the source electrode and the drain electrode. In this case, regions of the oxide semiconductor film in contact with the source electrode and the drain electrode become n-type regions due to the formation of oxygen vacancies. The n-type regions serve as a source region and a drain region, resulting in a decrease in the contact resistance between the oxide semiconductor film and the source electrode and between the oxide semiconductor film and the drain electrode. Accordingly, the formation of the n-type regions increases the mobility and on-state current of the transistor 15, achieving the high-speed operation of a semiconductor device using the transistor 15.

Note that the extraction of oxygen by a metal in the source electrode and the drain electrode is probably caused when the source electrode and the drain electrode are formed by a sputtering method or the like or when heat treatment is performed after the formation of the source electrode and the drain electrode. The n-type regions are more likely to be formed by forming the source electrode and the drain electrode with the use of a conductive material that is easily bonded to oxygen. Examples of such a conductive material include Al, Cr, Cu, Ta, Ti, Mo, and W.

Furthermore, in the case where the semiconductor film including the stacked oxide semiconductor films is used in the transistor 15, the regions having n-type conductivity preferably extend to the oxide semiconductor film 82*b* serving as a channel region in order that the mobility and on-state current of the transistor 15 can be further increased and the semiconductor device can operate at higher speed.

The insulating film 81 preferably has a function of supplying part of oxygen to the oxide semiconductor films 82*a* to 82*c* by heating. It is preferable that the number of defects in the insulating film 81 be small, and typically the spin density of g=2.001 due to a dangling bond of silicon be lower than or equal to $1\times10^{18}$ spins/cm$^3$. The spin density is measured by ESR spectroscopy.

The insulating film 81, which has a function of supplying part of the oxygen to the oxide semiconductor films 82*a* to 82*c* by heating, is preferably an oxide. Examples of the oxide include aluminum oxide, magnesium oxide, silicon oxide, silicon oxynitride, silicon nitride oxide, gallium oxide, germanium oxide, yttrium oxide, zirconium oxide, lanthanum oxide, neodymium oxide, hafnium oxide, and tantalum oxide. The insulating film 81 can be formed by a plasma chemical vapor deposition (CVD) method, a sputtering method, or the like.

Note that in this specification, oxynitride contains more oxygen than nitrogen, and nitride oxide contains more nitrogen than oxygen.

Note that in the transistor 15 illustrated in FIGS. 17A to 17C and FIGS. 18A to 18C, the conductive film 86 overlaps with end portions of the oxide semiconductor film 82*b* including a channel region that do not overlap with the conductive films 83 and 84, i.e., end portions of the oxide semiconductor film 82*b* that are in a region different from a region where the conductive films 83 and 84 are located. When the end portions of the oxide semiconductor film 82*b* are exposed to plasma by etching for forming the end portions, chlorine radical, fluorine radical, or the like generated from an etching gas is easily bonded to a metal element contained in the oxide semiconductor. For this reason, in the end portions of the oxide semiconductor film, oxygen bonded to the metal element is easily eliminated, so that an oxygen vacancy is easily formed; thus, the oxide semiconductor film easily has n-type conductivity. However, an electric field applied to the end portions can be adjusted by controlling the potentials of the conductive film 86 because the end portions of the oxide semiconductor film 82*b* that do not overlap with the conductive films 83 and 84 overlap with the conductive film 86 in the transistor 15 illustrated in FIGS. 17A to 17C and FIGS. 18A to 18C. Consequently, the flow of current between the conductive films 83 and 84 through the end portions of the oxide semiconductor film 82*b* can be controlled by the potential supplied to the conductive film 86. Such a structure of the transistor 15 is referred to as a surrounded channel (s-channel) structure.

With the s-channel structure, specifically, when a potential at which the transistor 15 is turned off is supplied to the conductive film 86, the amount of off-state current that flows between the conductive films 83 and 84 through the end portions of the oxide semiconductor film 82*b* can be reduced. For this reason, in the transistor 15, even when the distance between the conductive films 83 and 84 at the end portions of the oxide semiconductor film 82*b* is reduced as a result of reducing the channel length to obtain high on-state current, the transistor 15 can have low off-state current. Consequently, with the short channel length, the transistor 15 can have high on-state current when in an on state and low off-state current when in an off state.

With the s-channel structure, specifically, when a potential at which the transistor 15 is turned on is supplied to the conductive film 86, the amount of current that flows between the conductive films 83 and 84 through the end portions of the oxide semiconductor film 82*b* can be increased. The current contributes to an increase in the field-effect mobility and an increase in on-state current of the transistor 15. When the end portions of the oxide semiconductor film 82*b* overlap with the conductive film 86, carriers flow in a wide region of the oxide semiconductor film 82*b* as well as in a region in the vicinity of the interface between the oxide semiconductor film 82*b* and the insulating film 85, which results in an increase in carrier mobility the transistor 15. As a result, the on-state current of the transistor 15 is increased, and the field-effect mobility is increased to greater than or equal to 10 cm$^2$/V·s or to greater than or equal to 20 cm$^2$/V·s, for example. Note that here, the field-effect mobility is not an approximate value of the mobility as the physical property of the oxide semiconductor film but is an index of current drive capability and the apparent field-effect mobility of a saturation region of the transistor.

A structure of the oxide semiconductor film is described below.

An oxide semiconductor film is classified roughly into a single-crystal oxide semiconductor film and a non-single-crystal oxide semiconductor film. The non-single-crystal oxide semiconductor film includes any of an amorphous oxide semiconductor film, a microcrystalline oxide semiconductor film, a polycrystalline oxide semiconductor film, a c-axis aligned crystalline oxide semiconductor (CAAC-OS) film, and the like.

The amorphous oxide semiconductor film has disordered atomic arrangement and no crystalline component. A typical example thereof is an oxide semiconductor film in which no crystal part exists even in a microscopic region, and the whole of the film is amorphous.

The microcrystalline oxide semiconductor film includes a microcrystal (also referred to as nanocrystal) with a size greater than or equal to 1 nm and less than 10 nm, for example. Thus, the microcrystalline oxide semiconductor film has a higher degree of atomic order than the amorphous oxide semiconductor film. Hence, the density of defect states of the microcrystalline oxide semiconductor film is lower than that of the amorphous oxide semiconductor film.

The CAAC-OS film is one of oxide semiconductor films including a plurality of crystal parts, and most of the crystal parts each fit inside a cube whose one side is less than 100 nm. Thus, there is a case where a crystal part included in the CAAC-OS film fits inside a cube whose one side is less than 10 nm, less than 5 nm, or less than 3 nm. The density of defect states of the CAAC-OS film is lower than that of the microcrystalline oxide semiconductor film. In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

In the cross-sectional TEM image of the CAAC-OS film observed in a direction substantially parallel to the sample surface, metal atoms arranged in a layered manner are seen in the crystal parts. Each metal atom layer has a shape that reflects a surface over which the CAAC-OS film is formed (hereinafter, a surface over which the CAAC-OS film is formed is referred to as a formation surface) or a top surface of the CAAC-OS film, and is arranged parallel to the formation surface or the top surface of the CAAC-OS film.

On the other hand, according to the TEM image of the CAAC-OS film observed in a direction substantially perpendicular to the sample surface (plan TEM image), metal atoms are arranged in a triangular or hexagonal configuration in the crystal parts. However, there is no regularity of arrangement of metal atoms between different crystal parts.

From the results of the cross-sectional TEM observation and the plan-view TEM observation, alignment is found in the crystal parts in the CAAC-OS film.

A CAAC-OS film is subjected to structural analysis with an X-ray diffraction (XRD) apparatus. For example, when the CAAC-OS film including an InGaZnO$_4$ crystal is analyzed by an out-of-plane method, a peak appears frequently when the diffraction angle (2θ) is around 31°. This peak is derived from the (009) plane of the InGaZnO$_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when 2θ is around 56°. This peak is derived from the (110) plane of the InGaZnO$_4$ crystal. Here, analysis (φ scan) is performed under conditions where the sample is rotated around a normal vector of a sample surface as an axis (q, axis) with 2θ fixed at around 56°. In the case where the sample is a single-crystal oxide semiconductor film of InGaZnO$_4$, six peaks appear. The six peaks are derived from crystal planes equivalent to the (110) plane. On the other hand, in the case of a CAAC-OS film, a peak is not clearly observed even when φ scan is performed with 2θ fixed at around 56°.

According to the above results, in the CAAC-OS film having c-axis alignment, while the directions of a-axes and b-axes are irregularly oriented between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface. Thus, for example, in the case where a shape of the CAAC-OS film is changed by etching or the like, the c-axis might not be necessarily parallel to a normal vector of a formation surface or a normal vector of a top surface of the CAAC-OS film.

Further, the degree of crystallinity in the CAAC-OS film is not necessarily uniform. For example, in the case where crystal growth leading to the CAAC-OS film occurs from the vicinity of the top surface of the film, the degree of crystallinity in the vicinity of the top surface is higher than that in the vicinity of the formation surface in some cases. Further, when an impurity is added to the CAAC-OS film, the degree of crystallinity in a region to which the impurity is added is changed, and the degree of crystallinity in the CAAC-OS film varies depending on regions.

Note that when the CAAC-OS film with an InGaZnO$_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appear at around 31° and a peak of 2θ not appear at around 36°.

In a transistor including the CAAC-OS film, a change in electrical characteristics due to irradiation with visible light or ultraviolet light is small. Thus, the transistor has high reliability.

Note that an oxide semiconductor film may be a stacked film including two or more kinds of an amorphous oxide semiconductor film, a microcrystalline oxide semiconductor film, and a CAAC-OS film, for example.

For the deposition of the CAAC-OS film, the following conditions are preferably used.

By reducing the amount of impurities entering the CAAC-OS film during the deposition, the crystal state can be prevented from being broken by the impurities. For example, the concentration of impurities (e.g., hydrogen, water, carbon dioxide, and nitrogen) that exist in the treatment chamber may be reduced. Furthermore, the concentration of impurities in a deposition gas may be reduced. Specifically, a deposition gas whose dew point is −80° C. or lower, preferably −100° C. or lower is used.

By increasing the substrate heating temperature during the deposition, migration of a sputtered particle is likely to occur after the sputtered particle reaches a substrate surface. Specifically, the substrate heating temperature during the deposition is higher than or equal to 100° C. and lower than or equal to 740° C., preferably higher than or equal to 200° C. and lower than or equal to 500° C. By increasing the substrate heating temperature during the deposition, when the flat-plate-like or pellet-like sputtered particle reaches the substrate, migration occurs on the substrate surface, so that a flat plane of the sputtered particles is attached to the substrate.

Furthermore, it is preferable that the proportion of oxygen in the deposition gas be increased and the power be optimized in order to reduce plasma damage at the deposition. The proportion of oxygen in the deposition gas is higher than or equal to 30 vol %, preferably 100 vol %.

As an example of the target, an In—Ga—Zn oxide target is described below.

The In—Ga—Zn oxide target, which is polycrystalline, is made in the following manner: InO$_X$ powder, GaO$_Y$ powder, and ZnO$_Z$ powder are mixed in a predetermined molar ratio, pressure is applied to the mixture, and heat treatment is performed at a temperature of higher than or equal to 1000° C. and lower than or equal to 1500° C. Note that X, Y, and Z are each a given positive number. Here, the predetermined molar ratio of InO$_X$ powder to GaO$_Y$ powder and ZnO$_Z$ powder is, for example, 2:2:1, 8:4:3, 3:1:1, 1:1:1, 4:2:3, 4:2:4.1, or 3:1:2. The kinds of powder and the molar ratio for mixing powder may be determined as appropriate depending on the desired target.

An alkali metal is not an element included in an oxide semiconductor and thus is an impurity. Also, alkaline earth metal is an impurity in the case where the alkaline earth metal is not a component of the oxide semiconductor. Alkali metal, in particular, Na becomes Na$^+$ when an insulating film in contact with the oxide semiconductor film is an oxide and Na diffuses into the insulating film. Further, in the oxide semiconductor film, Na cuts or enters a bond between metal and oxygen that are included in the oxide semiconductor. As a result, for example, degradation of electrical characteristics of a transistor, such as a normally-on state of the transistor due to shift of the threshold voltage in the negative direction or reduction in mobility, occurs. In addition, variations in electrical characteristics also occur. Specifically, the Na concentration according to secondary ion mass spectrometry is reduced to preferably less than or equal to 5×10$^{16}$/cm$^3$, further preferably less than or equal to 1×10$^{16}$/ cm³, still further preferably less than or equal to $1\times10^{15}$/cm³. In a similar manner, the measurement value of Li concentration is preferably less than or equal to $5\times10^{15}$/cm³, further preferably less than or equal to $1\times10^{15}$/cm³. In a similar manner, the measurement value of K concentration is preferably less than or equal to $5\times10^{15}$/cm³, further preferably less than or equal to $1\times10^{15}$/cm³.

In the case where a metal oxide containing indium is used, silicon or carbon having higher bond energy with oxygen than indium might cut the bond between indium and oxygen, so that an oxygen vacancy is formed. Accordingly, when silicon or carbon is contained in the oxide semiconductor film, the electrical characteristics of the transistor are likely to deteriorate as in the case of using an alkali metal or an alkaline earth metal. Thus, the concentration of silicon and the concentration of carbon in the oxide semiconductor film are preferably low. Specifically, the carbon concentration or the silicon concentration measured by secondary ion mass spectrometry is preferably less than or equal to $1\times10^{18}$/cm³. In that case, the deterioration of the electrical characteristics of the transistor can be prevented, so that the reliability of the semiconductor device can be improved.

The structure described above in this embodiment can be combined as appropriate with any of the structures described in the other embodiments.

Embodiment 6

In this embodiment, an example of a chip including the semiconductor device of one embodiment of the present invention and an example of a module of an electronic device are described.

Figure 19A:
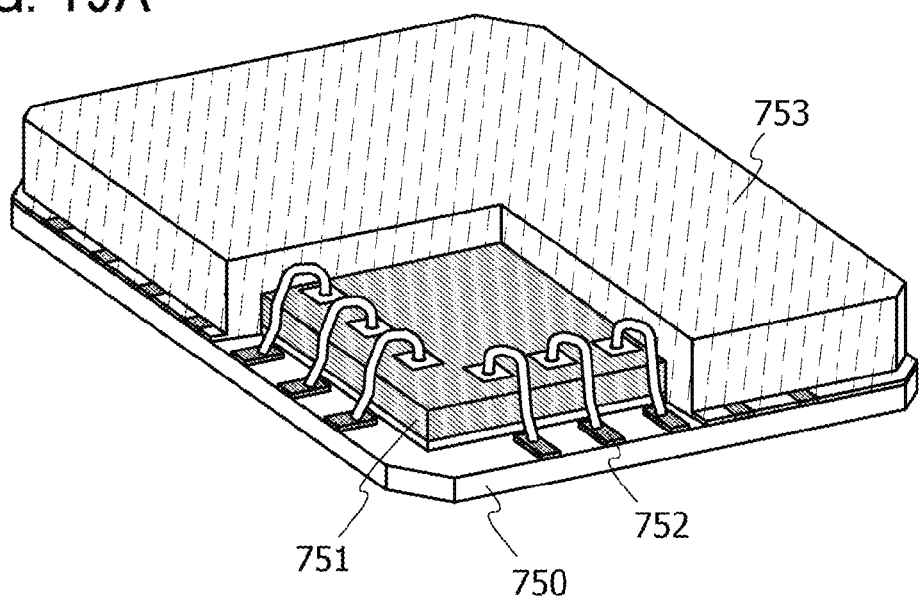
FIGS. 19A and 19B illustrate a chip and a module.

FIG. 19A is a perspective view illustrating a cross-sectional structure of a package using a lead frame interposer.

In the package illustrated in FIG. 19A, a chip 751 corresponding to the semiconductor device of one embodiment of the present invention is connected to a terminal 752 over an interposer 750 by a wire bonding method. The terminal 752 is placed on a surface of the interposer 750 on which the chip 751 is mounted. The chip 751 can be sealed by a mold resin 753, in which case the chip 751 is sealed so that part of each of the terminals 752 is exposed.

Figure 19B:
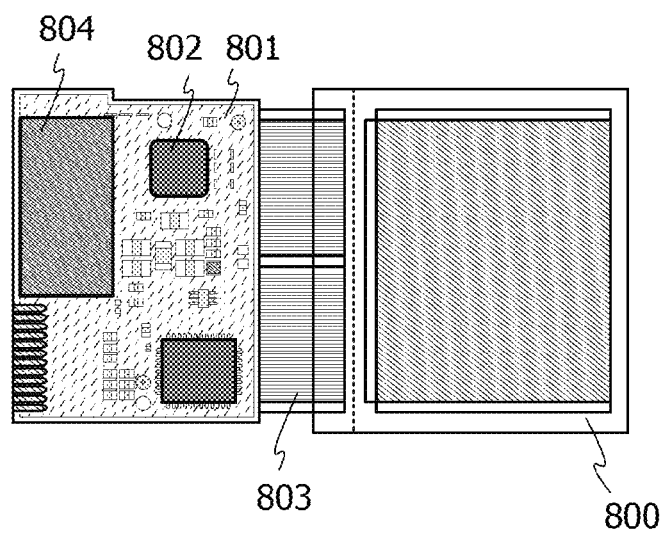

FIG. 19B illustrates the structure of a module of an electronic device in which the package is mounted on a circuit board.

In the module of a mobile phone illustrated in FIG. 19B, a package 802 and a battery 804 are mounted on a printed wiring board 801. In addition, the printed wiring board 801 is mounted on a panel 800 including a display element by an FPC 803.

The structure described above in this embodiment can be combined as appropriate with any of the structures described in the other embodiments.

Embodiment 7

The semiconductor device of one embodiment of the present invention can be used for display devices, personal computers, and image reproducing devices provided with recording media (typically, devices that reproduce the content of recording media such as digital versatile discs (DVDs) and have displays for displaying the reproduced images). Other examples of electronic devices that can include the semiconductor device of one embodiment of the present invention are mobile phones, game machines including portable game machines, portable information terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), and vending machines. Specific examples of these electronic devices are illustrated in FIGS. 20A to 20F.

Figure 20A:
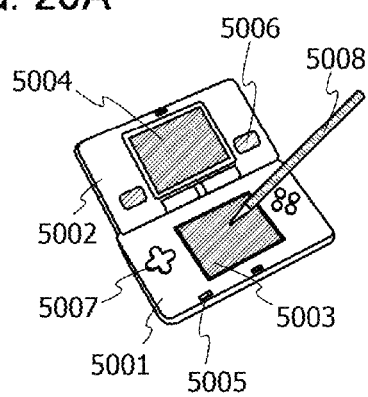
FIGS. 20A to 20F illustrate electronic devices.

FIG. 20A illustrates a portable game machine, which includes a housing 5001, a housing 5002, a display portion 5003, a display portion 5004, a microphone 5005, speakers 5006, a control key 5007, a stylus 5008, and the like. The semiconductor device of one embodiment of the present invention can be used for a variety of integrated circuits included in the portable game machine. Note that although the portable game machine in FIG. 20A has the two display portions 5003 and 5004, the number of display portions included in the portable game machine is not limited thereto.

Figure 20B:
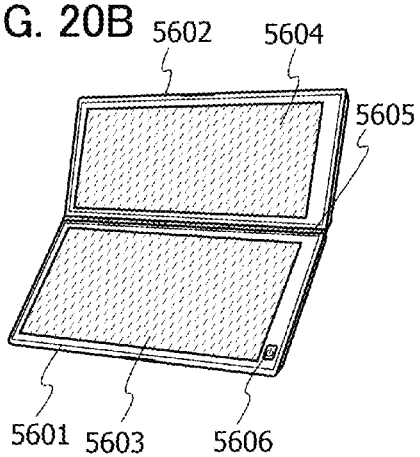

FIG. 20B illustrates a portable information terminal, which includes a first housing 5601, a second housing 5602, a first display portion 5603, a second display portion 5604, a joint 5605, an operation key 5606, and the like. The first display portion 5603 is provided in the first housing 5601, and the second display portion 5604 is provided in the second housing 5602. The first housing 5601 and the second housing 5602 are connected to each other with the joint 5605, and the angle between the first housing 5601 and the second housing 5602 can be changed with the joint 5605. An image on the first display portion 5603 may be switched depending on the angle between the first housing 5601 and the second housing 5602 at the joint 5605. The semiconductor device of one embodiment of the present invention can be used for a variety of integrated circuits included in the portable information terminal. A display device with a position input function may be used as at least one of the first display portion 5603 and the second display portion 5604. Note that the position input function can be added by providing a touch panel in a display device. Alternatively, the position input function can be added by provision of a photoelectric conversion element called a photosensor in a pixel area of a display device.

Figure 20C:
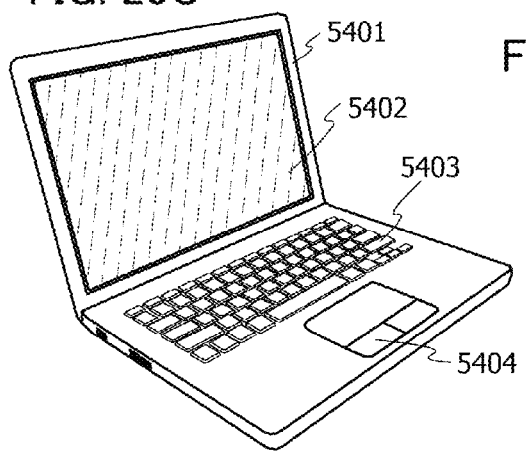

FIG. 20C illustrates a notebook personal computer, which includes a housing 5401, a display portion 5402, a keyboard 5403, a pointing device 5404, and the like. The semiconductor device of one embodiment of the present invention can be used for a variety of integrated circuits included in the notebook personal computer.

Figure 20D:
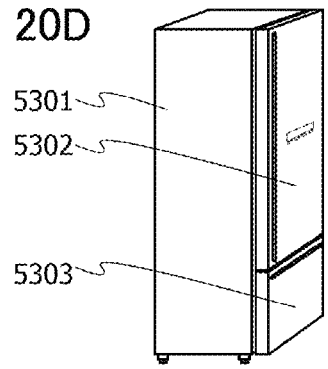

FIG. 20D illustrates an electric refrigerator-freezer, which includes a housing 5301, a door for a refrigerator 5302, a door for a freezer 5303, and the like. The semiconductor device of one embodiment of the present invention can be used for a variety of integrated circuits included in the electric refrigerator-freezer.

Figure 20E:
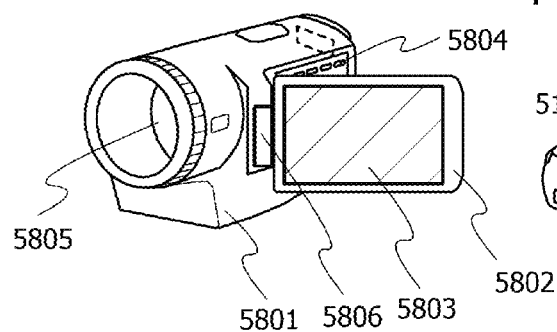

FIG. 20E illustrates a video camera, which includes a first housing 5801, a second housing 5802, a display portion 5803, operation keys 5804, a lens 5805, a joint 5806, and the like. The operation keys 5804 and the lens 5805 are provided for the first housing 5801, and the display portion 5803 is provided for the second housing 5802. The semiconductor device of one embodiment of the present invention can be used for a variety of integrated circuits included in the video camera. The first housing 5801 and the second housing 5802 are connected to each other with the joint 5806, and the angle between the first housing 5801 and the second housing 5802 can be changed with the joint 5806. Images displayed on the display portion 5803 may be switched in accordance with the angle at the joint 5806 between the first housing 5801 and the second housing 5802.

Figure 20F:
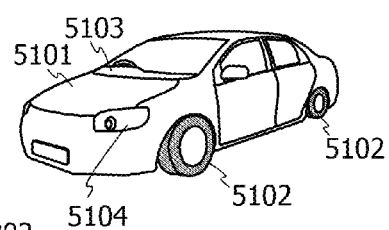

FIG. 20F illustrates a motor vehicle, which includes a car body 5101, wheels 5102, a dashboard 5103, lights 5104, and the like. The semiconductor device of one embodiment of the present invention can be used for a variety of integrated circuits included in the motor vehicle.

This application is based on Japanese Patent Application serial no. 2014-122062 filed with Japan Patent Office on Jun. 13, 2014, the entire contents of which are hereby incorporated by reference.

What is claimed is:

1. A semiconductor device comprising:
a processor configured to process a plurality of routines, the processor comprising:
a first circuit configured to store data corresponding to one of the plurality of routines; and
a second circuit comprising a plurality of memory portions; and
a register controller configured to supply a first signal and a second signal to the plurality of memory portions,
wherein one of the plurality of memory portions is configured to store the data corresponding to the one of the plurality of routines in accordance with the first signal, the data being supplied from the first circuit,
wherein the first circuit is configured to restore the data corresponding to the one of the plurality of routines in accordance with the second signal, the data being supplied from the one of the plurality of memory portions, and
wherein each of the plurality of memory portions comprises:
a first transistor, one of a source and a drain of the first transistor being electrically connected to the first circuit, and a channel formation region of the first transistor comprising an oxide semiconductor;
a capacitor, one electrode of the capacitor being electrically connected to the other of the source and the drain of the first transistor; and
a second transistor, one of a source and a drain of the second transistor being electrically connected to the first circuit, and a gate of the second transistor being electrically connected to the one electrode of the capacitor,
wherein the first signal is supplied to the gate of the first transistor from the register controller.

2. The semiconductor device according to claim 1, wherein the first circuit and the second circuit are included in a register.

3. The semiconductor device according to claim 1, wherein a first data stored in one of the plurality of memory portions and a second data stored in another one of the plurality of memory portions correspond to different routines.

4. The semiconductor device according to claim 1, wherein the oxide semiconductor comprises at least one of indium, gallium, and zinc.

5. The semiconductor device according to claim 1, wherein an off-state current per micrometer of a channel width of the first transistor is lower than or equal to 100 zA/μm.

6. A semiconductor device comprising:
a processor configured to process a plurality of routines, the processor comprising:
a first circuit configured to store data corresponding to one of the plurality of routines; and
a second circuit comprising a plurality of memory portions; and
a register controller configured to supply a first signal and a second signal to the plurality of memory portions,
wherein one of the plurality of memory portions is configured to store the data corresponding to the one of the plurality of routines in accordance with the first signal, the data being supplied from the first circuit,
wherein the first circuit is configured to restore the data corresponding to the one of the plurality of routines in accordance with the second signal, the data being supplied from the one of the plurality of memory portions, and
wherein each of the plurality of memory portions comprises:
a first transistor, one of a source and a drain of the first transistor being electrically connected to the first circuit, and a channel formation region of the first transistor comprising an oxide semiconductor;
a capacitor, one electrode of the capacitor being electrically connected to the other of the source and the drain of the first transistor;
a second transistor, a gate of the second transistor being electrically connected to the one electrode of the capacitor; and
a third transistor, one of a source and a drain of the third transistor being electrically connected to one of a source and a drain of the second transistor, and the other of the source and the drain of the third transistor being electrically connected to the first circuit,
wherein the first signal is supplied to the gate of the first transistor from the register controller, and
wherein the second signal is supplied to the gate of the third transistor from the register controller.

7. The semiconductor device according to claim 6, wherein the first circuit and the second circuit are included in a register.

8. The semiconductor device according to claim 6, wherein a first data stored in one of the plurality of memory portions and a second data stored in another one of the plurality of memory portions correspond to different routines.

9. The semiconductor device according to claim 6, wherein the oxide semiconductor comprises at least one of indium, gallium, and zinc.

10. The semiconductor device according to claim 6, wherein an off-state current per micrometer of a channel width of the first transistor is lower than or equal to 100 zA/μm.

11. The semiconductor device according to claim 6,
wherein a channel formation region of the second transistor comprises silicon, and
wherein the first transistor is provided over the second transistor with an insulating film provided therebetween.

12. The semiconductor device according to claim 6,
wherein a channel formation region of the second transistor comprises silicon, and
wherein the first transistor and the capacitor are provided over the second transistor with an insulating film provided therebetween.

* * * * *